(12) United States Patent
Kim et al.

(10) Patent No.: US 8,035,110 B2
(45) Date of Patent: Oct. 11, 2011

(54) THIN-FILM TRANSISTOR SUBSTRATE HAVING OXIDE ACTIVE LAYER PATTERNS AND METHOD OF FABRICATING THE SAME

(75) Inventors: Do-Hyun Kim, Seoul (KR); Pil-Sang Yun, Seoul (KR); Ki-Won Kim, Suwon-si (KR); Dong-Hoon Lee, Seoul (KR); Chang-Oh Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 150 days.

(21) Appl. No.: 12/498,816

(22) Filed: Jul. 7, 2009

(65) Prior Publication Data

US 2010/0148169 A1  Jun. 17, 2010

(30) Foreign Application Priority Data

Dec. 17, 2008  (KR) .................. 10-2008-0128678

(51) Int. Cl.
  *H01L 29/04* (2006.01)
(52) U.S. Cl. .................. 257/72; 257/E21.094
(58) Field of Classification Search .......... 257/59, 257/72, 359, E21.294
See application file for complete search history.

(56) References Cited

U.S. PATENT DOCUMENTS

| | | | |
|---|---|---|---|
| 5,327,001 A * | 7/1994 | Wakai et al. | 257/350 |
| 7,619,244 B2 * | 11/2009 | Murakami et al. | 257/40 |
| 7,786,494 B2 * | 8/2010 | Lee et al. | 257/88 |
| 2004/0263746 A1 * | 12/2004 | Cho et al. | 349/139 |
| 2007/0152219 A1 * | 7/2007 | Lim | 257/59 |
| 2007/0262315 A1 * | 11/2007 | Lee et al. | 257/72 |
| 2008/0108226 A1 * | 5/2008 | Oh et al. | 438/762 |
| 2008/0277658 A1 * | 11/2008 | Lee et al. | 257/43 |
| 2009/0023254 A1 * | 1/2009 | Lim et al. | 438/151 |
| 2009/0039354 A1 * | 2/2009 | Wang et al. | 257/72 |
| 2009/0141207 A1 * | 6/2009 | Um et al. | 349/46 |
| 2009/0153056 A1 * | 6/2009 | Chen et al. | 315/51 |
| 2009/0180045 A1 * | 7/2009 | Yoon et al. | 349/43 |
| 2010/0001284 A1 * | 1/2010 | Cho et al. | 257/72 |
| 2010/0022055 A1 * | 1/2010 | Bae et al. | 438/158 |
| 2010/0051942 A1 * | 3/2010 | Ryu et al. | 257/43 |
| 2010/0159624 A1 * | 6/2010 | Cho et al. | 438/34 |

FOREIGN PATENT DOCUMENTS

| | | |
|---|---|---|
| JP | 2007-096055 | 4/2007 |
| KR | 1020080043092 A | 5/2008 |
| KR | 1020080048936 A | 6/2008 |

* cited by examiner

*Primary Examiner* — Nathan Ha
(74) *Attorney, Agent, or Firm* — Cantor Colburn LLP

(57) ABSTRACT

A thin-film transistor (TFT) substrate has improved electrical properties and reduced appearance defects and a method of fabricating the TFT substrate, are provided. The TFT substrate includes: gate wiring which is formed on a surface of an insulating substrate; oxide active layer patterns which are formed on the gate wiring and include an oxide of a first material; buffer layer patterns which are disposed on the oxide active layer patterns to directly contact the oxide active layer patterns and include a second material; and data wiring which is formed on the buffer layer patterns to insulatedly cross the gate wiring, wherein a Gibbs free energy of the oxide of the first material is lower than a Gibbs free energy of an oxide of the second material.

20 Claims, 20 Drawing Sheets

THIN-FILM TRANSISTOR SUBSTRATE HAVING OXIDE ACTIVE LAYER PATTERNS AND METHOD OF FABRICATING THE SAME

This application claims priority to Korean Patent Application No. 10-2008-0128678, filed on Dec. 17, 2008, and all the benefits accruing therefrom under 35 U.S.C. 119, the disclosure of which is incorporated herein by reference in its entirety.

BACKGROUND OF THE INVENTION

1. Field of the Invention

The present invention relates to a thin-film transistor ("TFT") substrate and a method of fabricating the same, and more particularly, to a TFT substrate which has improved electrical properties and reduced appearance defects and a method of fabricating the TFT substrate.

2. Description of the Related Art

Liquid crystal displays ("LCDs") are one of the most widely used flat panel displays ("FPDs"). An LCD includes two substrates having electrodes formed thereon and a liquid crystal layer interposed between the two substrates. In the LCD, voltages are applied to the electrodes to rearrange aligned liquid crystal molecules of the liquid crystal layer and thereby control the amount of light that passes through the liquid crystal layer.

A thin-film transistor ("TFT") substrate requires active layer patterns, which can supply or block electric charges when power is turned on or off. Currently, hydrogenated amorphous silicon ("a-Si:H") is widely being used for active layer patterns. Wiring of a TFT substrate using a material with low resistance in order to reduce the signal delay of the TFT substrate is also being considered for active layer patterns.

Disadvantageously, hydrogenated amorphous silicon has a relatively low charge mobility and on/off current ratio. In addition, since hydrogenated amorphous silicon has a small optical band gap, leakage photocurrent is generated from a backlight unit, and an afterimage is created due to an increase in the number of dangling bonds. Consequently, properties of a TFT substrate may deteriorate if active layer patterns of the TFT substrate are made of hydrogenated amorphous silicon.

When an oxide semiconductor is used for active layer patterns and when a material with low resistance is used for data wiring, leakage current and signal delay can be reduced. In this case, however, materials included in the active layer patterns may react with materials included in the data wiring. As a result, defects may occur, such as, for example, where a surface of the data wiring may protrude.

BRIEF SUMMARY OF THE INVENTION

In an exemplary embodiment, a thin-film transistor (TFT) substrate which has improved electrical properties and reduced appearance defects.

In an exemplary embodiment, method of fabricating a TFT substrate which has improved electrical properties and reduced appearance defects is also provided.

In an exemplary embodiment, a TFT substrate including: gate wiring which is formed on a surface of an insulating substrate; oxide active layer patterns which are formed on the gate wiring and include an oxide of a first material; buffer layer patterns which are disposed on the oxide active layer patterns to directly contact the oxide active layer patterns and include a second material; and data wiring which is formed on the buffer layer patterns to insulatedly cross the gate wiring, wherein a Gibbs free energy of the oxide of the first material is lower than a Gibbs free energy of an oxide of the second material.

In another exemplary embodiment, a TFT substrate including: gate wiring which is formed on a surface of an insulating substrate; oxide active layer patterns which are formed on the gate wiring and include indium zinc oxide (InZnO), and hafnium (Hf) or gallium (Ga); buffer layer patterns which are disposed on the oxide active layer patterns to directly contact the oxide active layer patterns and include titanium nitride (TiNx) or molybdenum (Mo); and data wiring which is formed on the buffer layer patterns to insulatedly cross the gate wiring, wherein a Gibbs free energy of an oxide of hafnium or an oxide of gallium, that of an oxide of indium (In), and that of an oxide of zinc (Zn) are lower than a Gibbs free energy of an oxide of titanium nitride or an oxide of molybdenum.

In another exemplary embodiment, a method of fabricating a TFT substrate is provided. The method includes: forming gate wiring on a surface of an insulating substrate; forming oxide active layer patterns, which include an oxide of a first material, on the gate wiring; forming buffer layer patterns, which include a second material, on the oxide active layer patterns to directly contact the oxide active layer patterns; and forming data wiring on the buffer layer patterns to insulatedly cross the gate wiring; wherein a Gibbs free energy of the oxide of the first material is lower than a Gibbs free energy of an oxide of the second material.

In an exemplary embodiment, a method of fabricating a TFT substrate is provided. The method includes: forming gate wiring on a surface of an insulating substrate; forming oxide active layer patterns, which include indium zinc oxide, and hafnium or gallium, on the gate wiring; forming buffer layer patterns, which include titanium nitride or molybdenum, on the oxide active layer patterns to directly contact the oxide active layer patterns; and forming data wiring on the buffer layer patterns to insulatedly cross the gate wiring; wherein a Gibbs free energy of each of an oxide of hafnium or an oxide of gallium, that of an oxide of indium, and that of an oxide of zinc are lower than a Gibbs free energy of an oxide of titanium nitride or an oxide of molybdenum.

BRIEF DESCRIPTION OF THE DRAWINGS

The above and other aspects and features will become more apparent by describing in detail exemplary embodiments thereof with reference to the attached drawings, in which.

DETAILED DESCRIPTION OF THE INVENTION

Figure 1A:
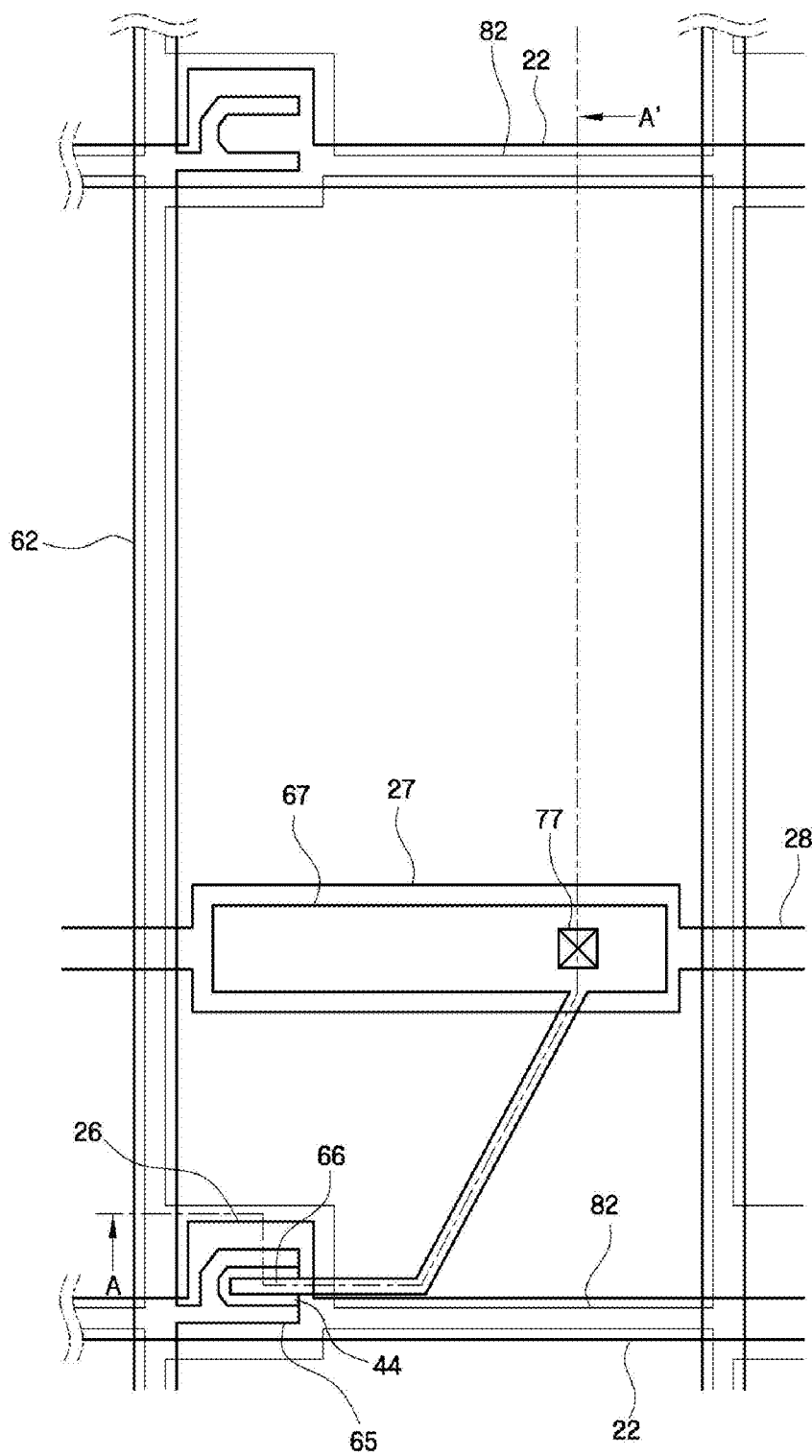
FIG. 1A is a layout diagram of a thin-film transistor (TFT) substrate according to first and second exemplary embodiments.

Advantages and features of the invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In some embodiments, well-known processing processes, well-known structures and well-known technologies will not be specifically described in order to avoid ambiguous interpretation of the present invention. Like reference numerals refer to like elements throughout the specification. Where an element is disclosed as being "on" another element, it will be appreciated that the elements may be in direct contact or other elements may be intervening. Where an element is disclosed as being "directly on" another element, it will be understood that no intervening element is present between contacting elements. Where "horizontal" is used to describe orientation of an element, it will be understood to mean for purposes of this application that the orientation is along the x direction in the x-y plane view of any substrate element. Similarly, where "vertical" is used to describe orientation of an element, it will be understood to mean for purposes of this application that the orientation of the element is along the y-axis, in the x-y plane view of any substrate element.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below," "beneath," "lower," "above," "upper," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or components would then be oriented "above" the other elements or components. Thus, the exemplary term "below" or "beneath" can encompass both an orientation of above and below. The device may be otherwise oriented and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof.

Embodiments of the invention are described herein with reference to (plan and) cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
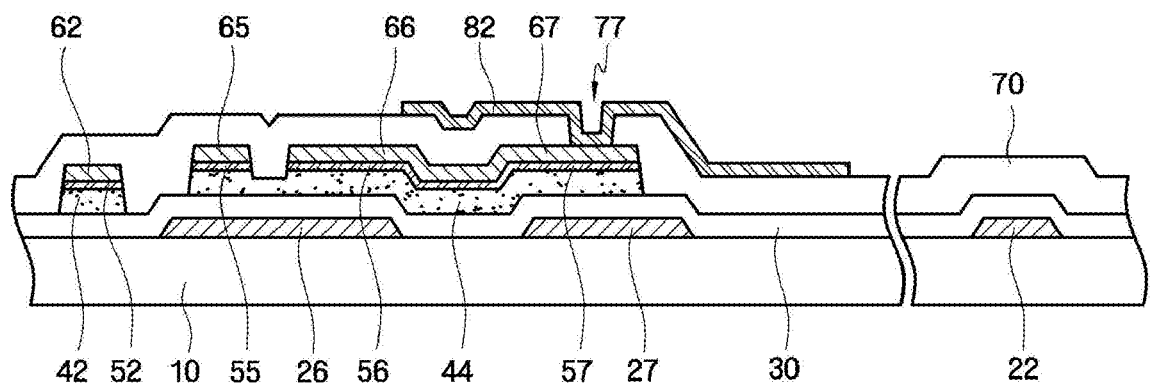
FIG. 1B is a cross-sectional view of the TFT substrate according to the first and second exemplary embodiments, taken along the line A-A' of FIG. 1A.

Hereinafter, a thin-film transistor (TFT) substrate according to first and second exemplary embodiments will be described in detail with reference to FIGS. 1A and 1B. FIG. 1A is a layout diagram of the TFT substrate according to the first and second exemplary embodiments. FIG. 1B is a cross-sectional view of the TFT substrate according to the first and second exemplary embodiments, taken along the line A-A' of FIG. 1A.

Referring to FIGS. 1A and 1B, the TFT substrate includes various devices, such as TFTs, which are formed on a surface of an insulating substrate 10. The insulating substrate 10 is made of glass, such as soda lime glass or borosilicate glass, or plastic.

Gate wiring, which delivers a gate signal, is also formed on a surface of the insulating substrate 10. The gate wiring includes a gate line 22 which extends in a direction, for example, a horizontal direction (i.e., along the x axis of the plane view of the substrate), and a gate electrode 26 which protrudes vertically from the gate line 22 and is included in the structure of a TFT.

In addition, storage wiring is formed on a surface of the insulating substrate 10. The storage wiring delivers a common voltage and includes a storage electrode 27 and a storage line 28. The storage line 28 may extend in the horizontal direction to be substantially parallel to the gate line 22. The storage electrode 27 may be wider than the storage line 28. The storage electrode 27 is overlapped by a drain electrode extension portion 67 connected to a pixel electrode 82, which will be described later, to form a storage capacitor that improves the charge storage capability of a pixel.

The storage wiring may have various shapes and may be disposed at various locations. In addition, if sufficient storage capacitance is generated by the overlapping of the pixel electrode 82 and the gate line 22, the storage wiring may not be formed.

The gate wiring (i.e., the gate line 22 and the gate electrode 26) and the storage wiring (i.e., the storage electrode 27 and the storage line 28) may be made of an aluminum (Al)-based metal such as aluminum or an aluminum alloy, a silver (Ag)-based metal such as silver or a silver alloy, a copper (Cu)-based metal such as copper or a copper alloy, a molybdenum (Mo)-based metal such as molybdenum or a molybdenum alloy, chromium (Cr), titanium (Ti), or tantalum (Ta).

In addition, the gate wiring and the storage wiring may have a multi-layer structure composed of two conductive layers (not shown) with different physical characteristics. For example, one of the two conductive layers may be formed of metal with low resistivity, such as an aluminum-based metal, a silver-based metal, or a copper-based metal, in order to reduce signal delay and/or voltage drop of the gate wiring and the storage wiring. The other one of the two conductive layers may be formed of a different material, in particular, a material having superior contact characteristics with indium tin oxide ("ITO") and/or indium zinc oxide ("IZO"), such as a molybdenum-based metal, chromium, titanium, or tantalum. Examples of multi-layer structures include a chromium lower layer and an aluminum upper layer and an aluminum lower layer and a molybdenum upper layer. However, the multi-layer structures are not limited thereto. The gate wiring and the storage wiring may be formed of various metals and conductors as exemplified hereinabove.

A gate insulating film 30, which may be made of silicon oxide (SiOx) or silicon nitride (SiNx), is formed on the gate wiring and the storage wiring.

Oxide active layer patterns 42 and 44 are formed on the gate insulating film 30. The oxide active layer patterns 42 and 44 are made of an oxide of a material that is selected from the group consisting of zinc (Zn), indium (In), gallium (Ga), tin (Sn), and a combination of these metals. The term "active" denotes that the oxide active layer patterns 42 and 44 are made of an active material, i.e., one which has electrical properties when driving current is applied thereto. The active material includes a semiconductor and/or a metal oxide. The oxide active layer patterns 42 and 44 include a first material composed of one or more elements and an oxide of the first material. The first material may include zinc or indium. Specifically, the oxide active layer patterns 42 and 44 according to the embodiments may be made of indium zinc oxide (InZnO), indium gallium oxide (InGaO), indium tin oxide (InSnO), zinc tin oxide (ZnSnO), gallium tin oxide (GaSnO), gallium zinc oxide (GaZnO), gallium zinc tin oxide (GaZnSnO), gallium indium zinc oxide (GaInZnO), hafnium indium zinc oxide (HfInZnO), or zinc oxide (ZnO).

The oxide of the first material of the oxide active layer patterns 42 and 44 according to the embodiments has a Gibbs free energy, also referred to herein as a first Gibbs free energy. The first Gibbs free energy may be lower than the Gibbs free energy, also referred to herein as a second Gibbs free energy, of an oxide of a second material of buffer layer patterns 52 and 55 through 57 which will be described later. The first Gibbs free energy and the second Gibbs free energy will each be described in detail later.

The oxide active layer patterns 42 and 44 have 2 to 100 times greater an effective charge mobility than hydrogenated amorphous silicon, and have an on/off current ratio of $10^5$ to $10^8$. Thus, the oxide active layer patterns 42 and 44 each show excellent semiconductor properties. In addition, the oxide active layer patterns 42 and 44 each have a band gap of approximately 3.0 to 3.5 eV. Therefore, even when the oxide active layer patterns 42 and 44 are exposed to visible light, leakage of photocurrent from either of oxide active layer patterns 42 and 44 does not occur. Consequently, the formation of an instantaneous afterimage in an oxide TFT can be prevented. Furthermore, since there is no need to form a light-blocking film under the oxide TFT, an aperture ratio of the TFT substrate can be increased.

In order to enhance the properties of an oxide semiconductor, the oxide active layer patterns 42 and 44 may additionally include an element, which belongs to group 3, 4 or 5 of the periodic table, or a transition metal element. While the oxide of either oxide active layer patterns 42 and 44 is amorphous, the oxide has high effective charge mobility and can be formed by using a conventional method of fabricating amorphous silicon. Therefore, the oxide active layer patterns 42 and 44 can be applied to the fabrication of large display devices.

The shape of the oxide active layer patterns 42 and 44 may be identical to or different from that of data wiring. That is, the oxide active layer patterns 42 and 44 may be formed only in regions where the gate electrode 26 is overlapped by a source electrode 65 and a drain electrode 66. Thus, the oxide active layer patterns 42 and 44 may be island-shaped in the x-y plane. The oxide active layer patterns 42 and 44 may also be shaped substantially like, and when viewed along the thickness (z) axis (direction of view of the plane view), substantially overlapping with, the data wiring (i.e., a data line 62, the source electrode 65, the drain electrode 66, and a drain electrode extension portion 67), which will be described later, except for a channel region of the oxide TFT. That is, the oxide active layer patterns 42 and 44 may be formed to assume a linear shape and orientation along a horizontal direction.

The buffer layer patterns 52 and 55 through 57 are formed on the oxide active layer patterns 42 and 44. The buffer layer patterns 52 and 55 through 57 directly contact the oxide active layer patterns 42 and 44 and include the second material. The buffer layer patterns 52 and 55 through 57 function as an ohmic contact layer which reduces contact resistance between the data wiring and the oxide active layer patterns 52 and 55 through 57. In addition, the buffer layer patterns 52 and 55 through 57 prevent the first material of the oxide active layer patterns 42 and 44 from being reduced and intercalated into the data wiring. Thus, the second material of the buffer layer patterns 52 and 55 through 57 is selected from materials which can prevent the first material from being reduced and intercalated into the buffer layer patterns 52 and 55 through 57.

Specifically, as described above, the first Gibbs free energy, i.e., that of the oxide of the first material included in the oxide active layer patterns 42 and 44, is lower than the second Gibbs free energy, i.e., that of the oxide of the second material included in the buffer layer patterns 52 and 55 through 57. That is, the first material of the oxide active layer patterns 42 and 44 and the second material of the buffer layer patterns 52 and 55 through 57 are selected from materials which can make a bond between the first material and oxygen weaker than that between the second material and oxygen.

More specifically, the second material may be any material selected from the group consisting of titanium nitride (TiNx, where x is a natural number), molybdenum, amorphous indium tin oxide (a-ITO), indium zinc oxide (IZO), and combinations thereof. The second Gibbs free energy of the oxide of the second material is higher than the first Gibbs free energy of the oxide of the first material included in the oxide active layer patterns 42 and 44. For example, when the oxide of the first material is hafnium indium zinc oxide (HfInZnO) and when the second material is titanium nitride (TiNx), the first Gibbs free energy, i.e., that of an oxide (HfO$_2$) of hafnium, that of an oxide (InO$_2$) of indium, and that of an oxide (ZnO) of zinc, are all lower than the second Gibbs free energy, i.e., that of an oxide of titanium nitride. Accordingly, none of hafnium, indium and zinc in the first material reacts with the buffer layer patterns 52 and 55 through 57 and none are intercalated into the buffer layer patterns 52 and 55 through 57 or the data wiring. That is, the above elements of the first material remain stable. On the other hand, when titanium is used as the second material to form the buffer layer patterns 52 and 55 through 57 as in a first comparative example, which will be described later, indium and zinc of the first material are intercalated into the buffer layer patterns 52 and 55 through 57. As a result, the data wiring (i.e., the data line 62, the source electrode 65, the drain electrode 66, and the drain electrode extension portion 67) may manifest appearance defects, for example, may become convex and undesirably protrude in a vertical direction.

The first Gibbs free energy and the second Gibbs free energy may vary according to temperature. The Gibbs free energy of a material, such as indium, increases significantly as the processing temperature increases. Thus, the oxide active layer patterns 42 and 44, the buffer layer patterns 52 and 55 through 57, and the data wiring are of a material which can be patterned at low temperature.

The buffer layer patterns 52 and 55 through 57 may have a thickness of 50 to 1,000 Å, more specifically 50 to 300 Å. When the buffer layer patterns 52 and 55 through 57 are to have a thickness of less than 50 Å, they are not formed readily and may have undesirable variation in thickness and patterning defects. When the buffer layer patterns 52 and 55 through 57 are to have a thickness of more than 1,000 Å, their electrical resistance properties may deteriorate.

The data wiring is formed as shown in FIG. 1B, on the buffer layer patterns 52 and 55 through 57, and includes the data line 62, the source electrode 65, the drain electrode 66, and the drain electrode extension portion 67. The data line 62 extends in a vertical direction and insulatedly crosses (i.e., crosses over but not in contact with, so as to be electrically insulated from) the gate line 22 to define the edges of a pixel. The source electrode 65 branches off from the data line 62 and extends onto the oxide active layer patterns 42 and 44. The drain electrode 66 is separated from the source electrode 65 and formed on the oxide active layer patterns 42 and 44 to face the source electrode 65 with respect to the gate electrode 26 or the channel region of the oxide TFT. The wide drain electrode extension portion 67 extends from the drain electrode 66 and overlaps the storage electrode 27.

As shown in FIG. 1B, the data wiring (i.e., the data line 62, the source electrode 65, the drain electrode 66, and the drain electrode extension portion 67) may directly contact the buffer layer patterns 52 and 55 through 57 to form an ohmic contact. Since the buffer layer patterns 52 and 55 through 57 each function as an ohmic contact layer, the data wiring may be a monolayer which is made of a material having low resistance. For example, the data wiring may be made of copper, aluminum, or silver.

In order to improve ohmic contact properties, the data wiring may include a monolayer or a multilayer made of a material or materials selected from nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), and tantalum (Ta). Exemplary multilayer structures include those with a double material layer structure, such as Ta/Al, Ti/Al, Ni/Al, Co/Al or Mo (Mo alloy)/Cu, and those with a triple material layer structure such as Ti/Al/Ti, Ta/Al/Ta, Ti/Al/TiN, Ta/Al/TaN, Ni/Al/Ni or Co/Al/Co. The data wiring may also be made of materials other than the above materials.

The source electrode 65 overlaps at least part of the oxide active layer patterns 42 and 44, and the drain electrode 66 is separated from the source electrode 65 by the channel region of the oxide TFT and overlaps at least part of the oxide active layer patterns 42 and 44.

In FIG. 1B, a passivation layer 70 is formed on the data wiring (i.e., the data line 62, the source electrode 65, the drain electrode 66, and the drain electrode extension portion 67) and the oxide active layer patterns 42 and 44. The passivation layer 70 may be an organic or inorganic layer. Alternatively, the passivation layer 70 may be a double layer including a lower inorganic layer formed on the data wiring, and an upper organic layer formed on the lower inorganic layer, in which the double layer protects the oxide active layer pattern 44.

In order to improve an aperture ratio of the TFT substrate, the gate wiring (i.e., the gate line 22 and the gate electrode 26) and the data wiring (i.e., the data line 62, the source electrode 65, the drain electrode 66, and the drain electrode extension portion 67) may all be made of a transparent conductive material such as indium tin oxide (ITO), indium zinc oxide (IZO), or aluminum-doped zinc oxide (AZO).

A contact hole 77 is formed in the passivation layer 70 to expose the drain electrode extension portion 67. The pixel electrode 82 is formed on the passivation layer 70 to expose a portion of drain electrode extension portion 67, and is electrically connected to the drain electrode 66 through drain electrode extension portion 67 by the conductive material of pixel electrode 82 disposed in the contact hole 77.

The pixel electrode 82 may be made of a transparent conductor, such as indium tin oxide (ITO) or indium zinc oxide (IZO), or a reflective conductor such as aluminum. The pixel electrode 82 is electrically connected to the drain electrode extension portion 67 by the contact hole 77. When a data voltage is applied to the pixel electrode 82, the pixel electrode 82 generates an electric field together with a common electrode 250 of a common electrode substrate (not shown) and thus rotates the liquid crystal molecules of a liquid crystal layer (not shown) which is interposed between the TFT substrate and the common electrode substrate (not shown).

Figure 2A:
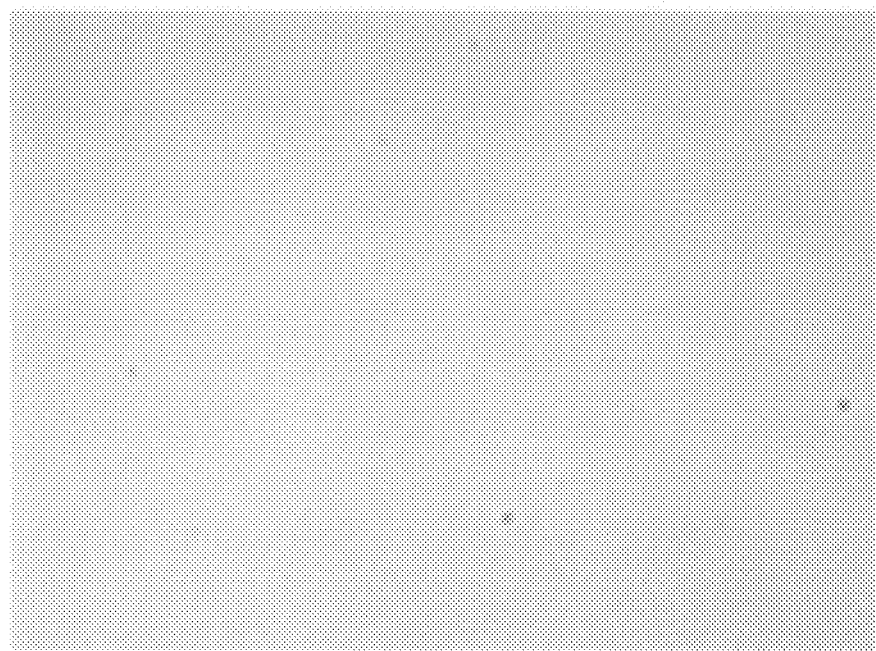
FIGS. 2A and 2B are photographs respectively showing the external appearance of data wiring of the TFT substrate according to the first exemplary embodiment and that of data wiring of a TFT substrate according to a first comparative example.
Figure 2B:
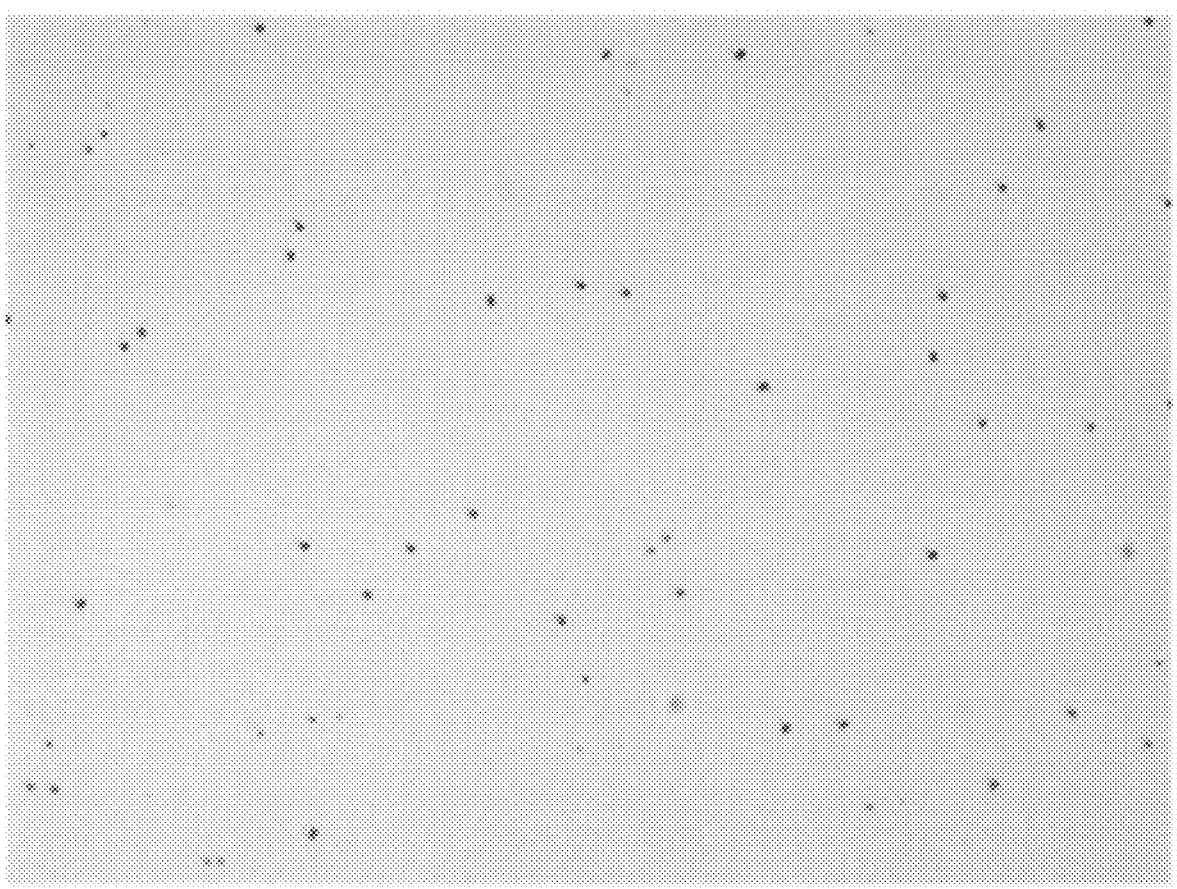
Figure 3:
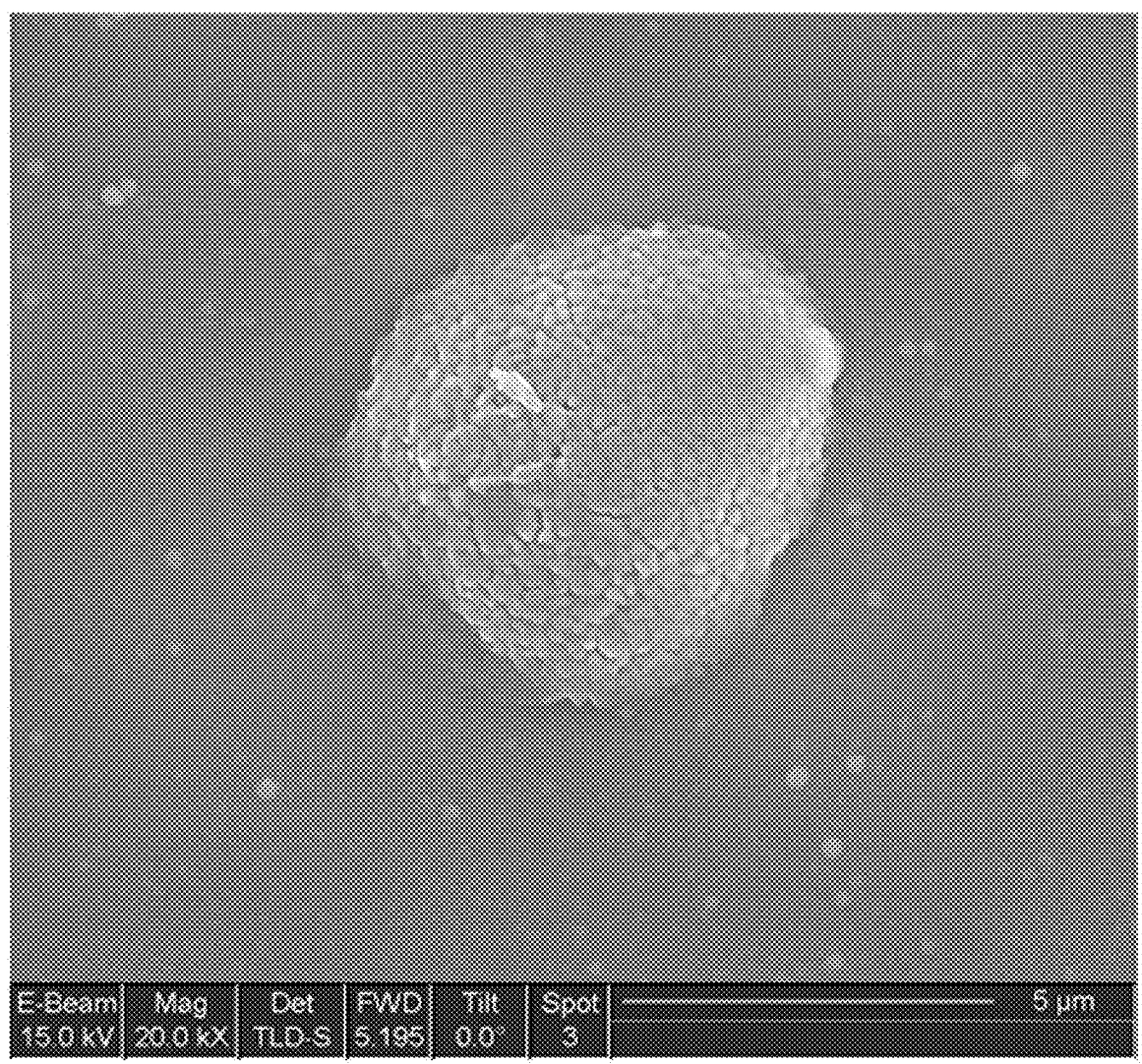
FIG. 3 is a photograph showing an enlarged version of the external appearance of the data wiring of the TFT substrate according to the first comparative example.
Figure 4:
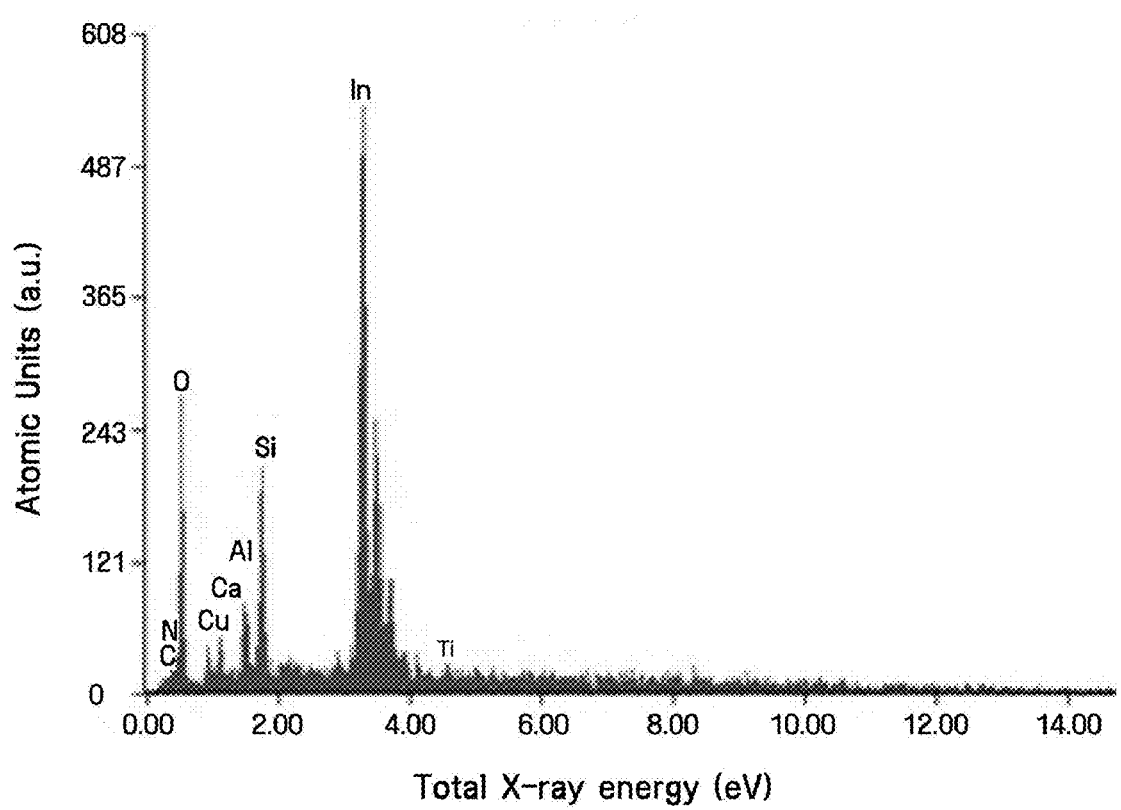
FIG. 4 is a graph illustrating analysis results of elements of the data wiring of the TFT substrate according to the first comparative example.
Figure 5A:
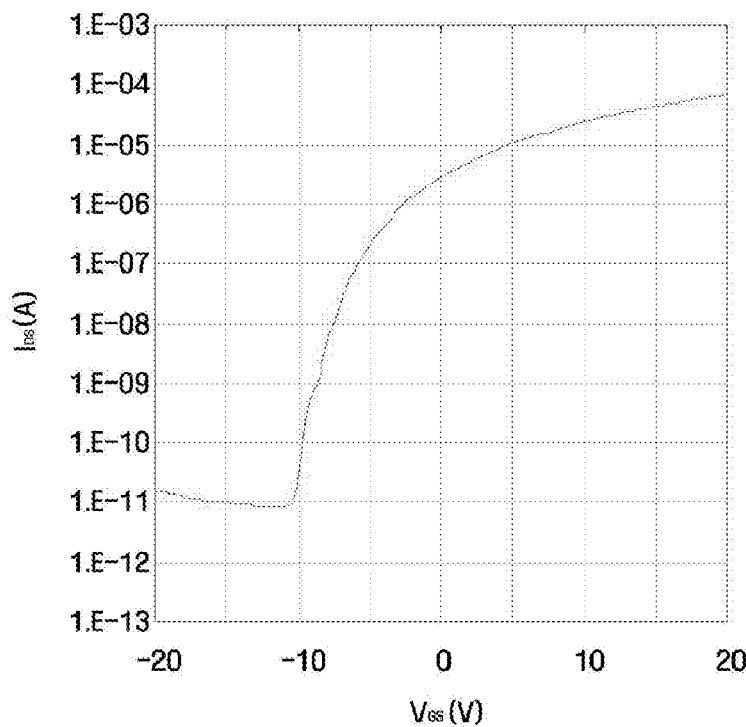
FIGS. 5A and 5B are graphs respectively illustrating voltage-current properties of the TFT substrate according to the first exemplary embodiment and those of the TFT substrate according to the first comparative example.
Figure 5B:
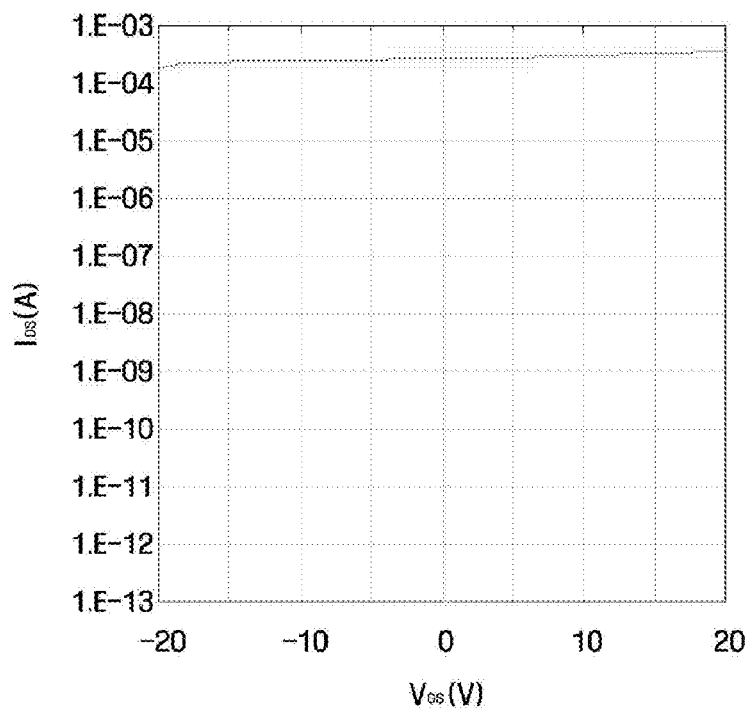
Figure 6A:
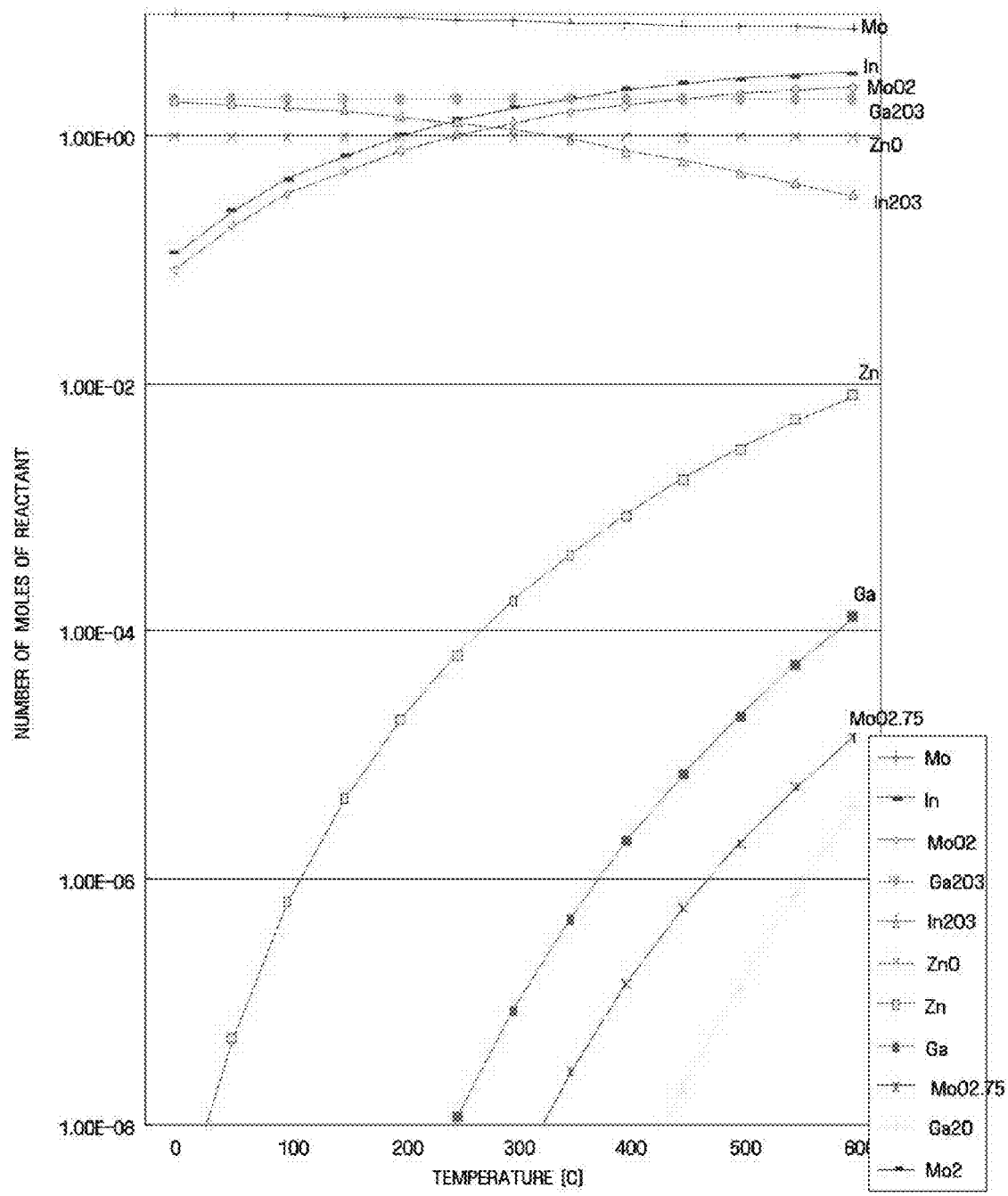
FIGS. 6A, 6B, and 6C are graphs illustrating oxide active layer pattern reactions with buffer layer pattern in the TFT substrate according to the second exemplary embodiment.
Figure 6B:
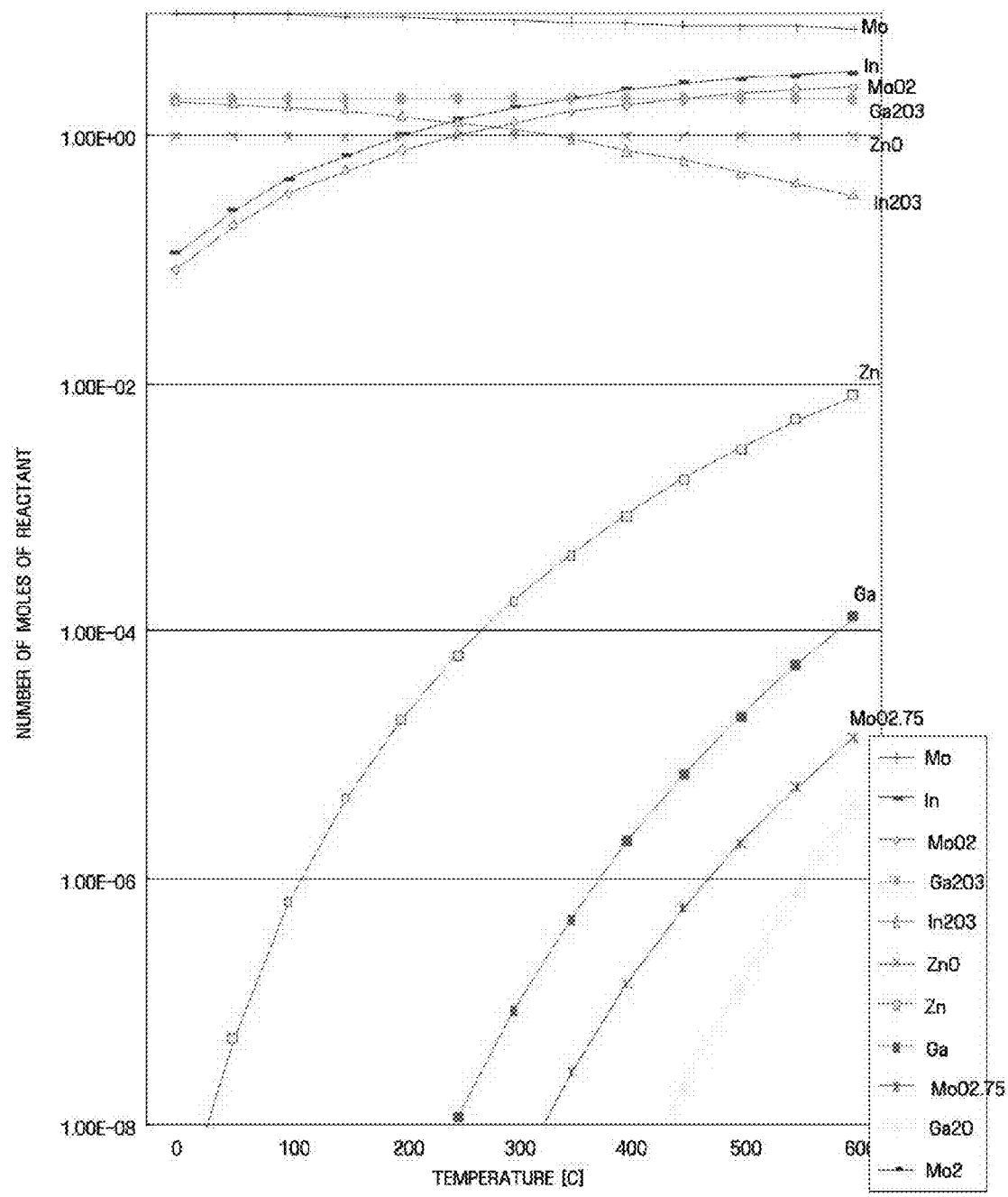
Figure 6C:
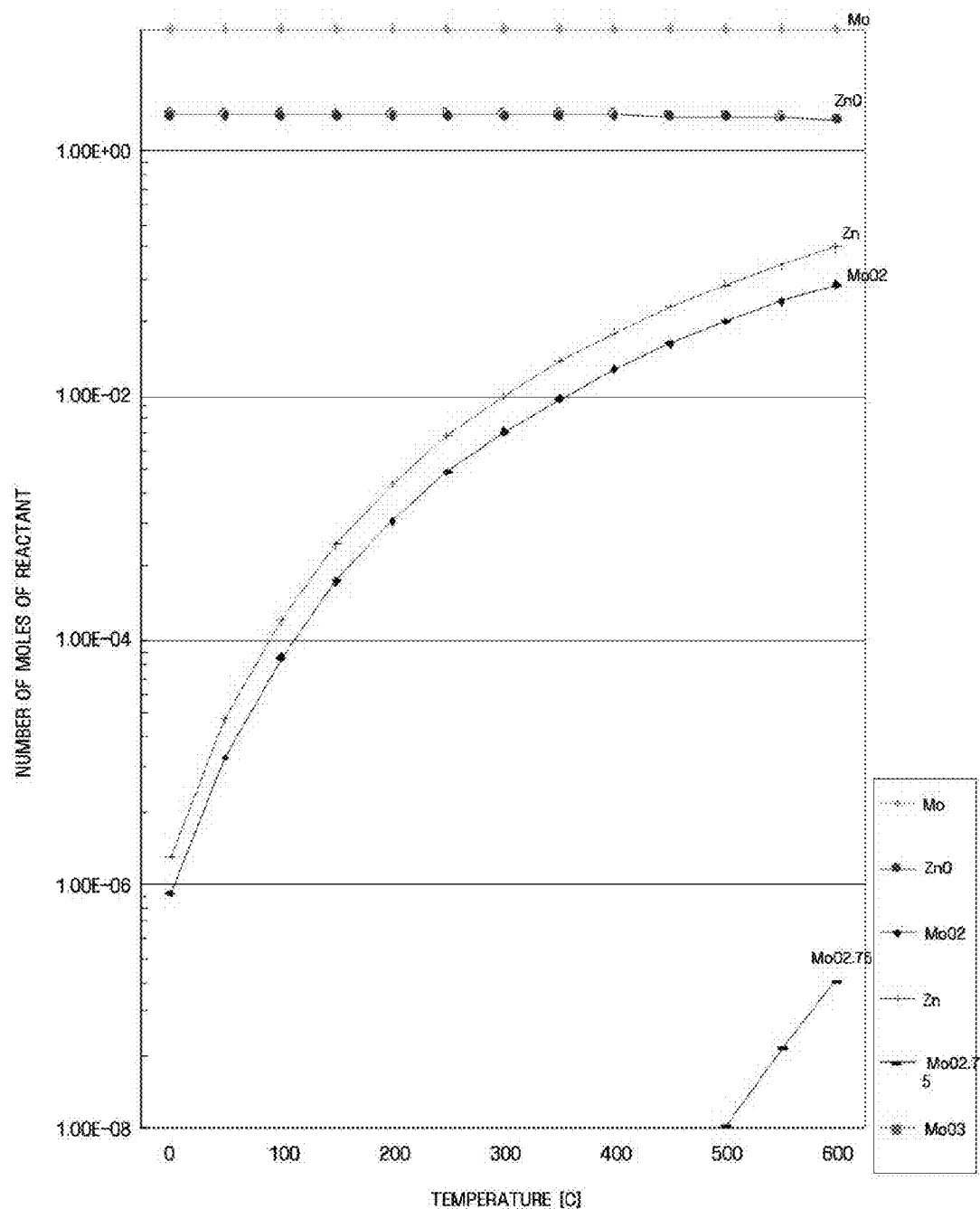
Figure 7A:
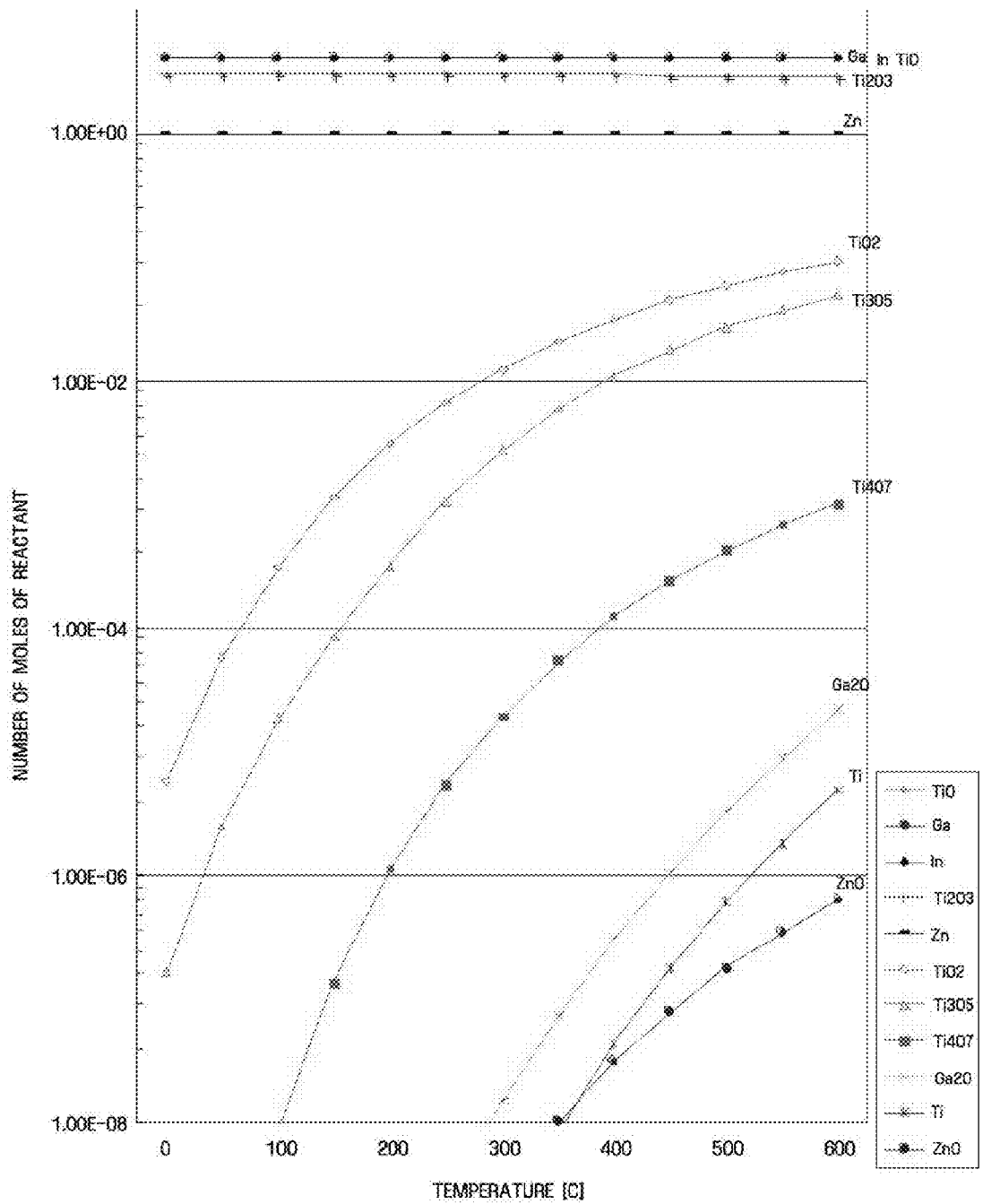
FIGS. 7A, 7B, and 7C are graphs illustrating oxide active layer pattern reactions with buffer layer patterns in the TFT substrate according to the first comparative example.
Figure 7B:
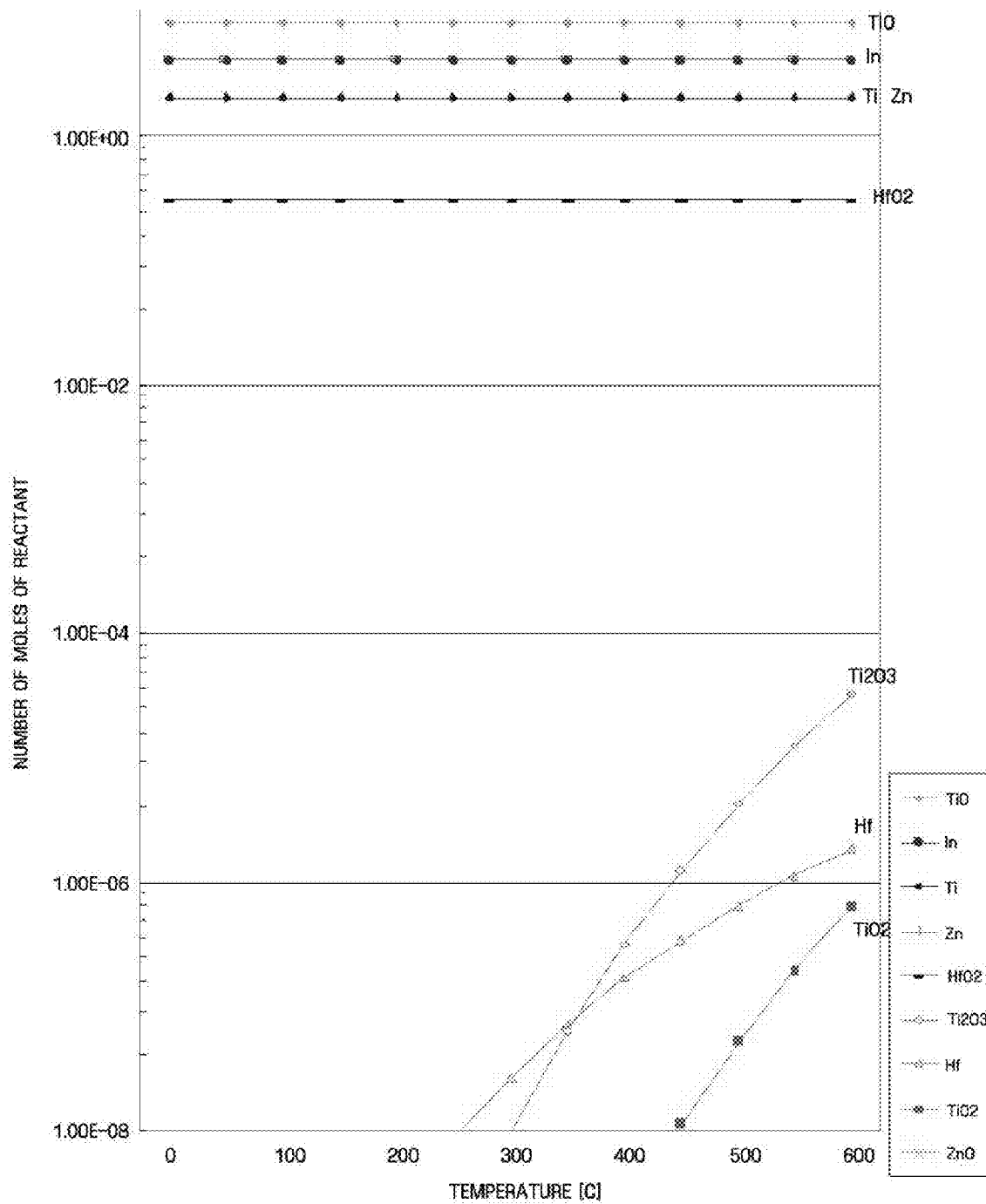
Figure 7C:
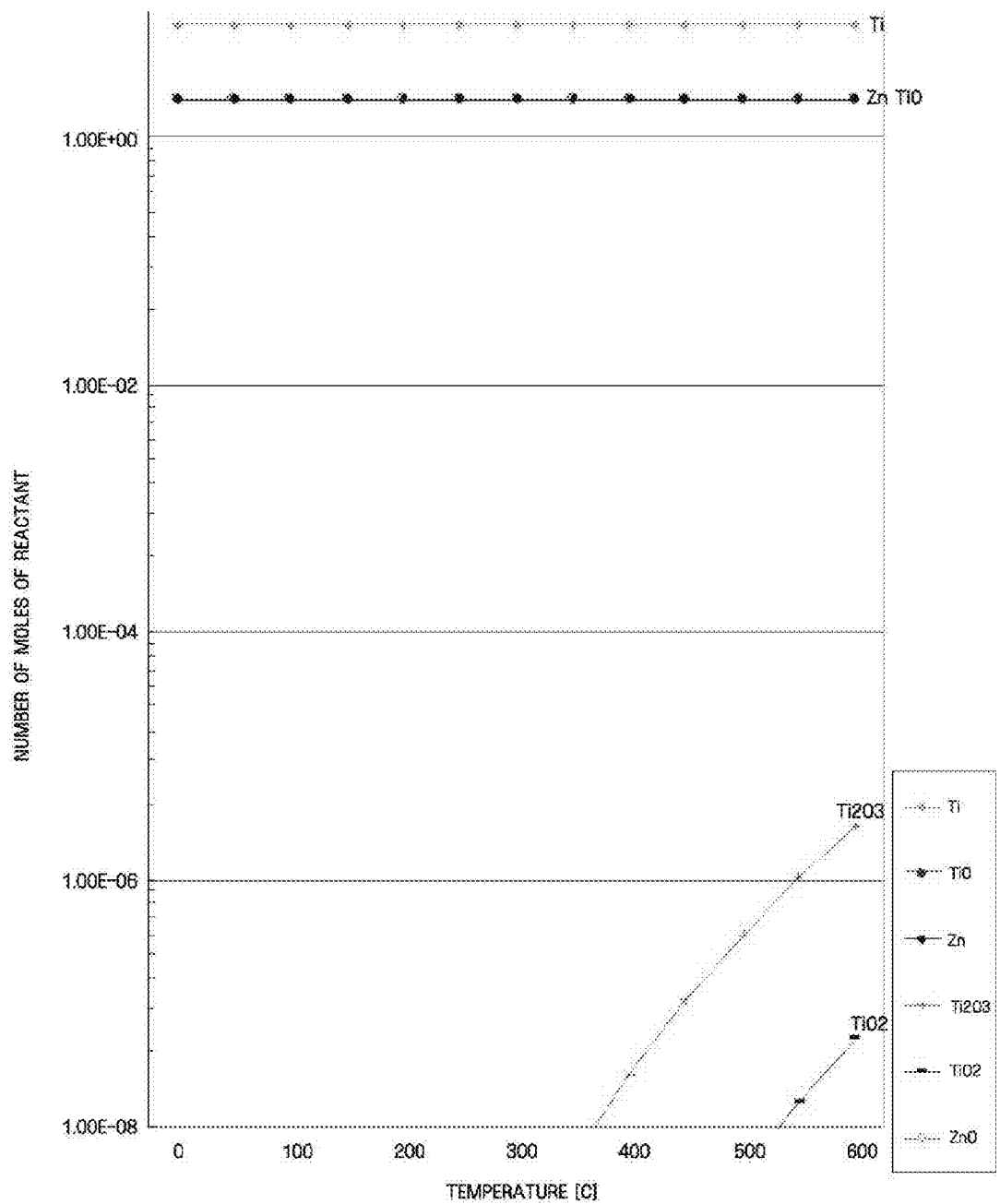
Figure 8A:
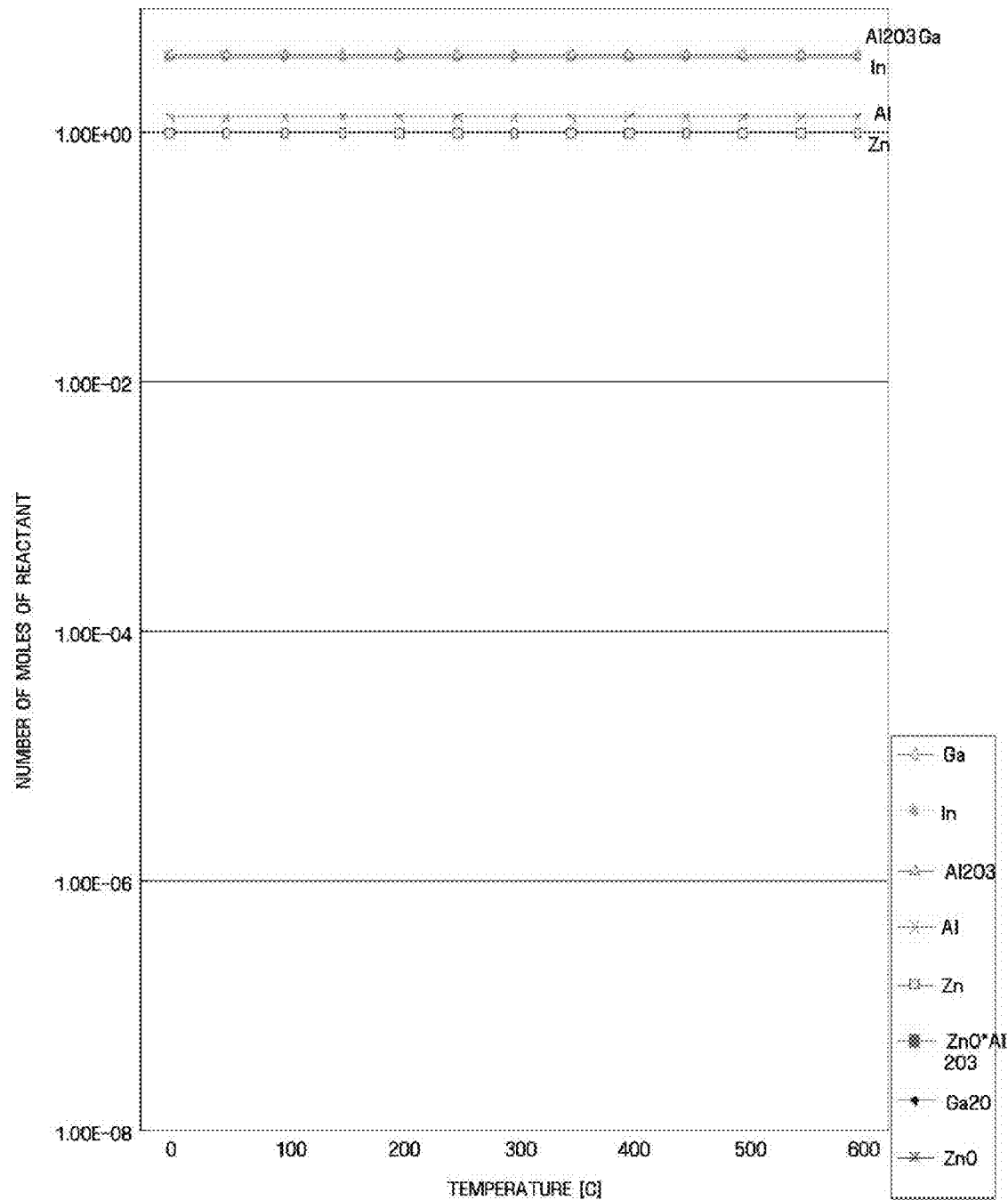
FIGS. 8A, 8B, and 8C are graphs illustrating oxide active layer pattern reactions with data wiring in a TFT substrate according to a second comparative example.
Figure 8B:
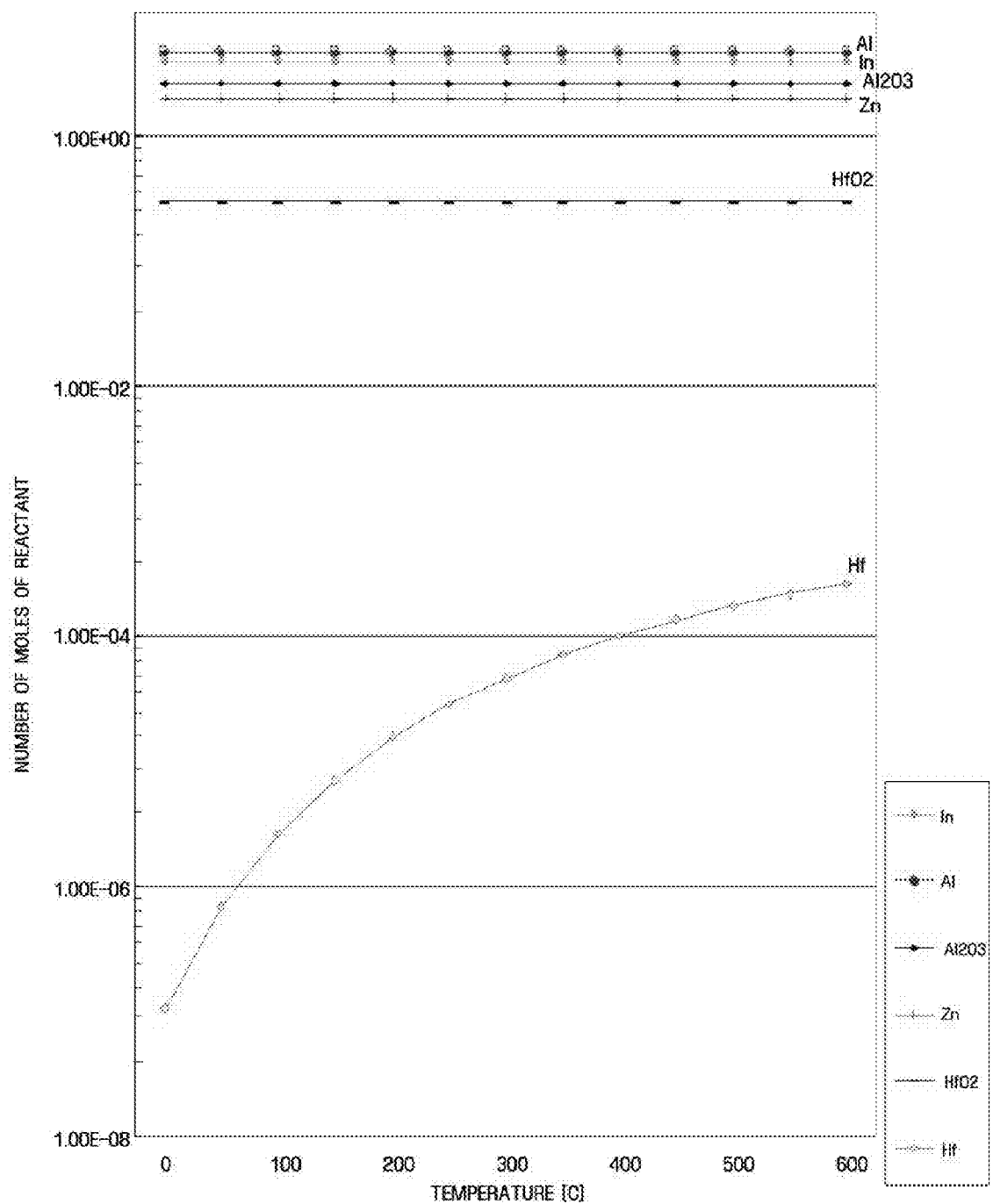
Figure 8C:
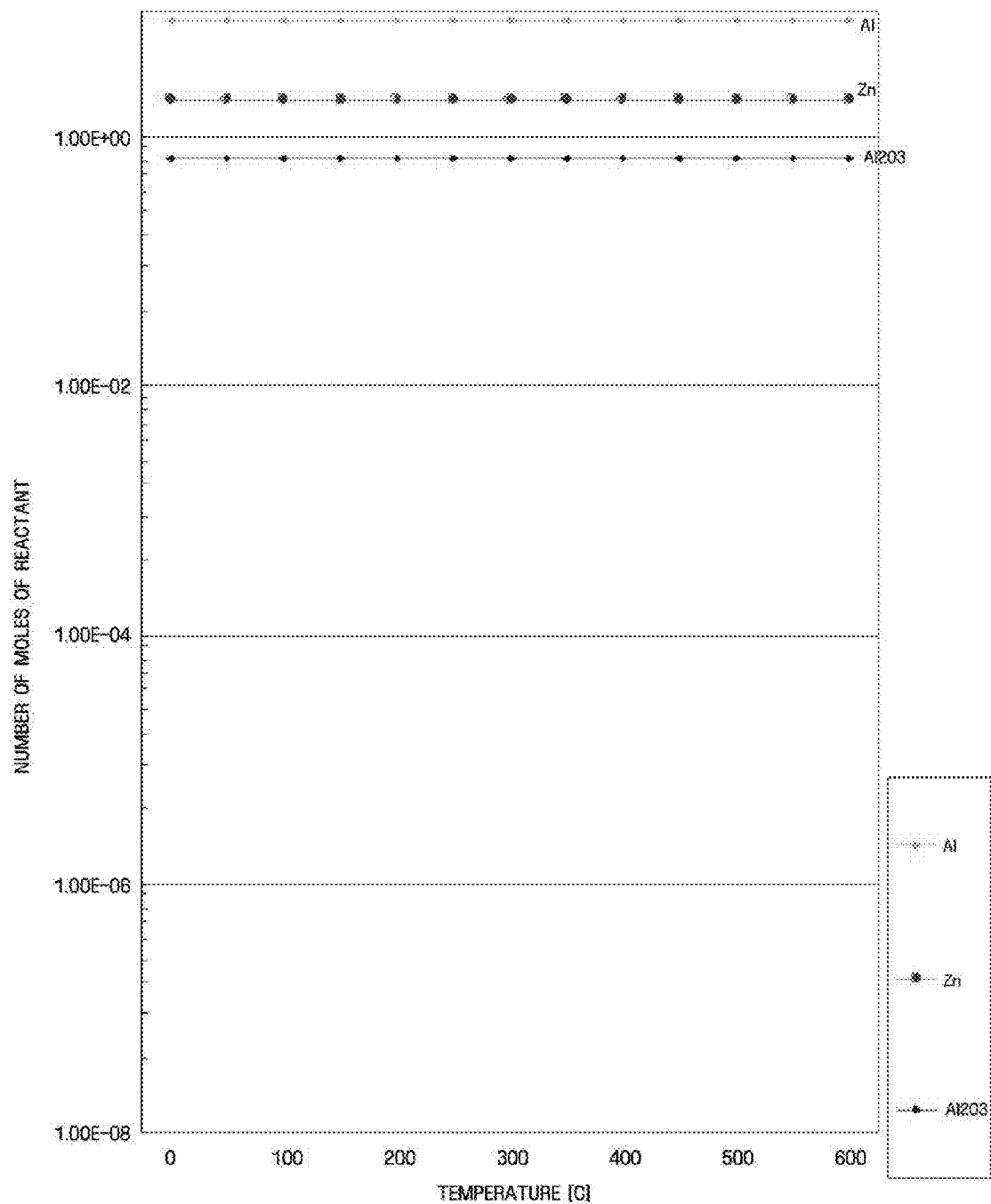

Hereinafter, the TFT substrate according to the first and second exemplary embodiments will be compared with TFT substrates according to comparative examples with reference to FIGS. 2A through 8C. FIGS. 2A and 2B are photographs respectively showing the external appearance of a portion of the surface of the material of the data wiring of the TFT substrate according to the first embodiment, and that of data wiring of the TFT substrate according to the first comparative example, respectively. FIG. 3 is a scanning electron microscope (SEM) micrograph showing an enlarged version of the external appearance of the data wiring of the TFT substrate according to the first comparative example. FIG. 4 is a graph of analysis results by energy dispersive X-ray spectroscopy ("EDX"), illustrated by a plot of absorbance (atomic units, a.u.) versus total energy (in electron volts, eV) of elements (C, N, O, Cu, Ca, Al, Si, In, and Ti) of the data wiring of the TFT substrate according to the first comparative example. FIGS. 5A and 5B are graphs respectively showing plots of drain-source current ($I_{DS}$) versus gate-source voltage ($V_{GS}$) illustrating voltage-current properties of the TFT substrate according to the first embodiment and those of the TFT substrate according to the first comparative example, respectively. FIGS. 6A through 6C are graphs showing plots of the number of moles of reactant versus temperature (degrees centigrade, °C.) and which illustrate whether the oxide active layer patterns 42 and 44 react with the buffer layer pattern 52 and 55 through 57 in the TFT substrate according to the second embodiment. FIGS. 7A through 7C are graphs showing plots of the number of moles of reactant versus temperature (° C.) and which illustrate whether oxide active layer patterns react with buffer layer patterns in the TFT substrate according to the first comparative example. FIGS. 8A through 8C are graphs showing plots of the number of moles of reactant versus temperature (° C.) and which illustrating whether oxide active layer patterns react with data wiring in a TFT substrate according to a second comparative example.

Referring to FIG. 2A, the data wiring (i.e., the data line 62, the source electrode 65, the drain electrode 66, and the drain electrode extension portion 67) of the TFT substrate according to the first embodiment shows few surface defects relative to the surface defectivity seen for the first comparative example (FIG. 2B). That is, no protrusions of data wiring material (such are formed on a surface of the data wiring, or no patterns are exfoliated from the surface of the data wiring. In the TFT substrate according to the first embodiment, hafnium indium zinc oxide (HfInZnO) is used for the oxide active layer patterns 42 and 44, titanium nitride (TiNx) is used for the buffer layer patterns 52 and 55 through 57, and copper or aluminum is used for the data wiring. In this case, the oxide active layer patterns 42 and 44 remain stable since the first Gibbs free energy, that of oxides of the first material (e.g., an oxide ($HfO_2$) of hafnium, an oxide ($InO_2$) of indium, and an oxide (ZnO) of zinc) is lower than the second Gibbs free energy, that of an oxide of titanium nitride (TiNx), i.e., the second material. Consequently, since the first material of the oxide active layer patterns 42 and 44 is not intercalated into the buffer layer patterns 52 and 55 through 57 or the data wiring, no defects occur.

Referring to FIG. 2B, data wiring of the TFT substrate according to the first comparative example has a greater number of observable surface defects than seen in the material of the first exemplary embodiment (FIG. 2A). That is, black dots are detected in a surface of the data wiring since protrusions are formed on patterns of the surface or the patterns are exfoliated. In the TFT substrate according to the first comparative example, hafnium indium zinc oxide (HfInZnO) is used for the oxide active layer patterns, titanium is used for the buffer layer patterns, and copper is used for the data wiring. In this case, the first Gibbs free energy of at least one of the oxide ($HfO_2$) of hafnium, the oxide ($InO_2$) of indium, and the oxide (ZnO) of zinc is higher than the second Gibbs free energy of an oxide of titanium. Accordingly, an oxide of at least one of hafnium, indium, and zinc in the first material reacts with the second material of the buffer layer patterns and is thus intercalated into the buffer layer patterns or the data wiring. It can be seen therefore that, for data wiring prepared according to the comparative example, appearance defects occur in significantly greater numbers than for the first exemplary embodiment.

Referring to FIG. 3, the data wiring of the TFT substrate according to the first comparative example shows surface protrusions since a material of the oxide active layer patterns is deposited on the data wiring. The protruding surface of the data wiring may cause current leakage during operation, and may degrade contact properties between the data wiring and a pixel electrode while increasing resistance therebetween, due to the presence of such defects.

Referring to FIG. 4, the first material of the oxide active layer patterns is deposited on the data wiring of the TFT substrate according to the first comparative example. The results of measuring the data wiring of the TFT substrate according to the first comparative example by using energy dispersive X-ray spectroscopy (EDX) are shown in FIG. 4. That is, the graph of FIG. 4 illustrates the relative amount of each element of the first material intercalated into the data wiring as a function of the number of atomic units with respect to total energy of an X ray. In FIG. 4, the x-axis represents total energy (eV) of an X ray, and the y-axis represents the atomic unit (a.u) of each intercalated element.

The deposition of each element measurable from FIG. 4 may be quantitatively represented as shown in Table 1 below.

TABLE 1

| Element | Weight % (wt %) | Atom % (At %) |
|---|---|---|
| C | 01.00 | 03.54 |
| N | 01.35 | 04.10 |
| O | 19.76 | 52.39 |
| Cu | 03.38 | 02.26 |
| Ga | 03.04 | 01.85 |
| Al | 02.29 | 03.60 |
| Si | 05.76 | 08.69 |
| In | 63.11 | 23.31 |
| Ti | 00.30 | 00.27 |

Referring to Table 1, in the first material of the oxide active layer patterns according to the first comparative example, indium is deposited in the largest amount. This is because the first Gibbs free energy of an indium oxide is higher than the second Gibbs free energy of a titanium oxide. Thus, indium reacts with the second material of the buffer layer patterns, and the reduced indium is intercalated into the surface of the buffer layer patterns and the data wiring.

Referring to FIG. 5A, the TFT substrate according to the first embodiment has TFT properties since a source-drain current $I_{DS}$ is increased as a gate voltage $V_{GS}$ increases. However, referring to FIG. 5B, the TFT substrate according to the first comparative example does not have TFT properties since the source-drain current $I_{DS}$ remains constant regardless of an increase in the gate voltage $V_{GS}$. That is, when hafnium indium zinc oxide (HfInZnO) is used for the oxide active layer patterns and when titanium is used for the buffer layer patterns as in the first comparative example, the resultant structure cannot be used as a TFT substrate.

Referring to FIGS. 6A through 6C, the oxide of the first material of the oxide active layer patterns 42 and 44 included in the TFT substrate according to the second embodiment does not react with the second material of the buffer layer patterns 52 and 55 through 57.

In the TFT substrate according to the second embodiment, gallium indium zinc oxide (GaInZnO), hafnium indium zinc oxide (HfInZnO), or zinc oxide (ZnO) is used for the oxide active layer patterns 42 and 44, molybdenum is used for the buffer layer patterns 52 and 55 through 57, and copper or aluminum is used for the data wiring. Each of FIGS. 6A through 6C illustrates whether the oxide of the first material reacts with the second material when gallium indium zinc oxide (GaInZnO), hafnium indium zinc oxide (HfInZnO), or zinc oxide (ZnO) (respectively) is used as the oxide of the first material and a sufficient amount of molybdenum is used as the second material. In FIGS. 6A through 8C, a molar ratio of gallium to indium to zinc is set to 2:2:1, and a molar ratio of hafnium to indium to zinc is set to 0.23:2:2. Referring to FIGS. 6A through 6C, a molybdenum oxide increases in a high-temperature region (i.e., above about 300° C.) but not in a low-temperature region (i.e., below about 300° C.). In addition, the first material such as hafnium, gallium, and indium are hardly intercalated, and zinc is hardly intercalated in the low-temperature region. Therefore, in the TFT substrate according to the second embodiment which includes the first and second materials, the first material included in the oxide active layer patterns 42 and 44 is not intercalated into the buffer layer patterns 52 and 55 through 57 or the data wiring. Thus, the data wiring for the first exemplary embodiments can have an even surface.

In the TFT substrate according to the first comparative example, either gallium indium zinc oxide (GaInZnO), hafnium indium zinc oxide (HfInZnO), or zinc oxide (ZnO) is used for the oxide active layer patterns, titanium is used for the buffer layer patterns, and copper or aluminum is used for the data wiring. Each of FIGS. 7A through 7C illustrates whether the oxide of the first material reacts with the second material when either gallium indium zinc oxide (GaInZnO), hafnium indium zinc oxide (HfInZnO), or zinc oxide (ZnO) (respectively) is used as the oxide of the first material and a sufficient amount of titanium is used as the second material. Referring to FIGS. 7A through 7C, titanium oxide increases in both the high-temperature and low-temperature regions. In addition, gallium and indium of the first material, excluding hafnium, are intercalated in large amounts. Therefore, in the TFT substrate according to the first comparative example which includes the first and second materials, the first material included in the oxide active layer patterns is intercalated into the buffer layer patterns or the data wiring, thereby causing appearance and compositional defects. As a result, the TFT substrate of the first comparative example cannot be used.

In the TFT substrate according to the second comparative example, either gallium indium zinc oxide (GaInZnO), hafnium indium zinc oxide (HfInZnO), or zinc oxide (ZnO) is used for the oxide active layer patterns (corresponding to FIGS. 8A through 8C, respectively), buffer layer patterns are not used, and aluminum is used for the data wiring. Each of FIGS. 8A through 8C illustrates whether the oxide of the first material reacts with the second material when gallium indium zinc oxide (GaInZnO), hafnium indium zinc oxide (HfInZnO), or zinc oxide (ZnO) is used as the oxide of the first material and a sufficient amount of titanium is used as the second material. Referring to FIGS. 8A through 8C, aluminum oxide is seen to increase in both the high-temperature and low-temperature regions. In addition, hafnium (FIG. 8B), gallium (FIG. 8A), and indium (FIGS. 8A and 8B) of the first material are seen to be intercalated in large amounts. Therefore, in the TFT substrate according to the second comparative example which includes the first material and aluminum, the first material included in the oxide active layer patterns is intercalated into the data wiring, thereby causing appearance and compositional defects. As a result, the TFT substrate cannot be used.

Hereinafter, a TFT substrate according to a third embodiment will be described in detail with reference to FIGS. 1B and 9 through 19. FIGS. 9 through 18 are cross-sectional views for sequentially explaining processes included in a method of fabricating the TFT substrate according to the third embodiment. FIG. 19 is a graph illustrating processing conditions under which the TFT substrate according to the third embodiment is fabricated.

Figure 9:
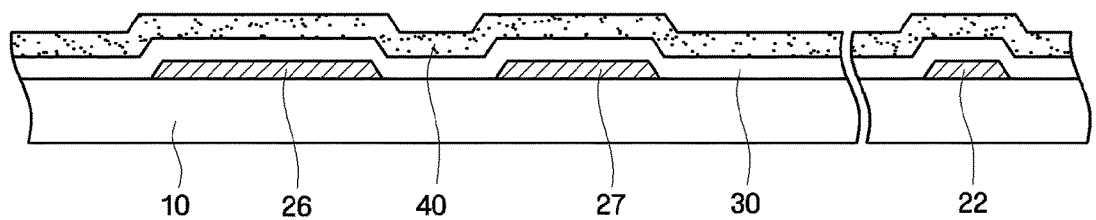
FIGS. 9 through 18 are each cross-sectional views for sequentially explaining processes included in a method of fabricating a TFT substrate according to a third exemplary embodiment.

Referring to FIG. 9, a metal layer (not shown) for forming gate wiring is disposed on a surface of an insulating substrate 10 and then patterned to form gate wiring which includes a gate line 22, a gate electrode 26, a storage electrode 27, and a storage line 28.

Here, sputtering may be performed to form the gate wiring which includes the gate line 22, the gate electrode 26, the storage electrode 27, and the storage line 28. Depending on the material of the gate wiring, sputtering may be performed at a low temperature of 200° C. or below. When the gate wiring is formed by sputtering at low temperature, the deterioration of the insulating substrate 10, which is made of, e.g., soda lime glass, can be prevented. Next, the above conductive layers are patterned by masking followed by a wet-etching process or a dry-etching process. In the wet-etching process, an etchant, such as phosphoric acid, nitric acid or acetic acid, may be used to form the pattern.

A gate insulating film 30 is deposited on the insulating substrate 10 and the gate wiring (i.e., the gate line 22, the gate electrode 26, the storage electrode 27 and the storage line 28). The gate insulating film 30 is made of, e.g., silicon nitride (SiNx) and is deposited by plasma enhanced chemical vapor deposition ("PECVD") or by reactive sputtering. If the insulating substrate 10 is made of a material with low thermal tolerance, the gate insulating film 30 may be formed at a low temperature of 130° C. or below.

Next, an oxide active layer 40 is deposited on the gate insulating film 30 by, for example, sputtering or chemical vapor deposition ("CVD"). Here, the term "active" denotes that the oxide active layer 40 is made of an active material which has electrical properties when driving current is applied thereto. The active material includes a semiconductor and a metal oxide. The oxide active layer 40 may be made of an oxide of a first material, that is, any one of indium zinc oxide (InZnO), indium gallium oxide (InGaO), indium tin oxide (InSnO), zinc tin oxide (ZnSnO), gallium tin oxide (GaSnO), gallium zinc oxide (GaZnO), gallium zinc tin oxide (GaZnSnO), gallium indium zinc oxide (GaInZnO), hafnium indium zinc oxide (HfInZnO), and zinc oxide (ZnO).

Figure 10:
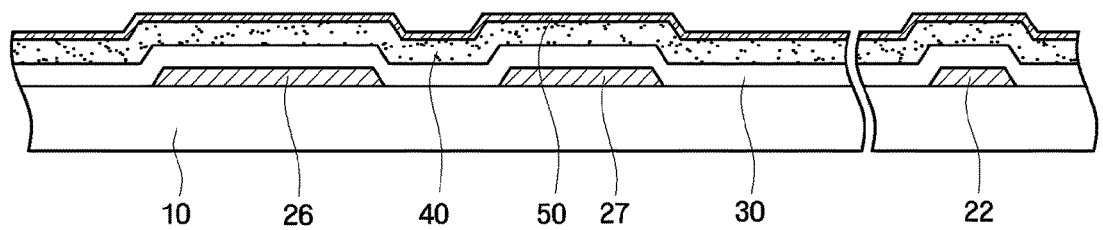
Figure 20:
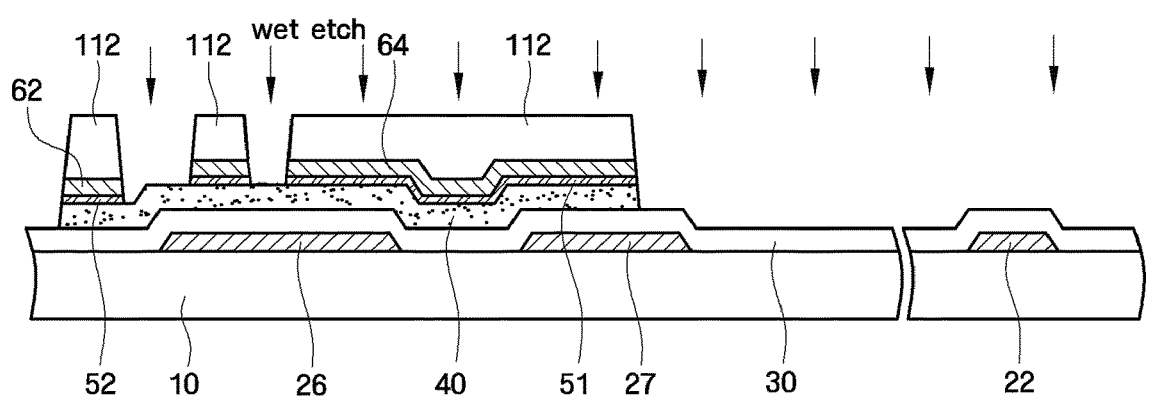
FIG. 20 is a cross-sectional view for explaining a method of fabricating a TFT substrate according to a fourth exemplary embodiment.

Referring to FIGS. 10 and 20, a buffer layer 50 is deposited on the oxide active layer 40 by, for example, sputtering or CVD. The buffer layer 50 according to an exemplary embodiment includes a second material. The second material may be any material selected from the group consisting of titanium nitride (TiNx), molybdenum, amorphous indium tin oxide ("a-ITO"), and indium zinc oxide (IZO). The first Gibbs free energy, i.e., that of the oxide of the first material, is lower than the second Gibbs free energy, i.e., that of an oxide of the second material. The buffer layer 50 may be formed by sputtering titanium using argon (Ar) and nitrogen ($N_2$) as reactive gases. In this case, a ratio of a flow rate (in the same units of, for example, standard cubic centimeters per minute, sccm) of argon to a flow rate of nitrogen may be 20:80 to 5:95. When the oxide active layer 40 and the buffer layer 50 are to be deposited as shown in FIG. 20, the buffer layer 50 can be made of titanium nitride (TiNx).

Figure 11:
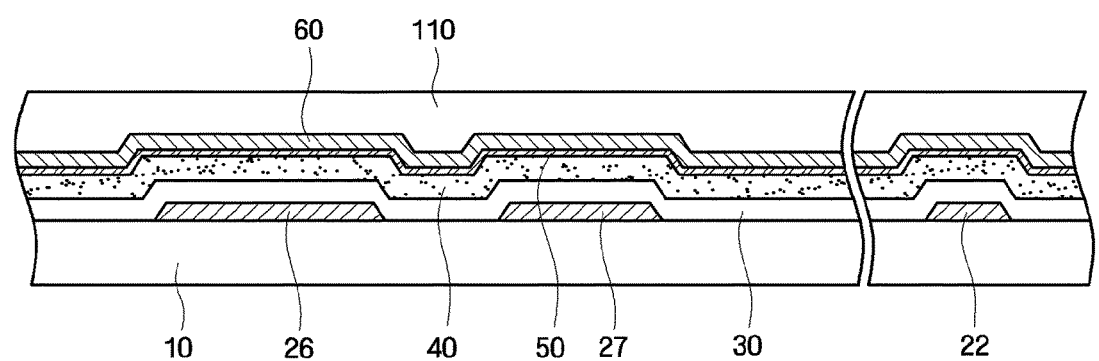

Referring to FIG. 11, a conductive layer 60 for forming data wiring is deposited on the buffer layer 50 by, for example, sputtering. Then, the conductive layer 60 is coated with a photoresist layer 110. The conductive layer 60 according to the present embodiment may be identical to the material of the data wiring (not shown) according to the first embodiment and may contain aluminum or copper. The conductive layer 60 for the data wiring is deposited at a low temperature, i.e., of 80 to 100° C. When the conductive layer 60 is formed at low temperature, the oxide active layer 40 is prevented from reacting with the buffer layer 50. Thus, the first material included in the oxide active layer 40 is not intercalated into the conductive layer 60.

Figure 12:
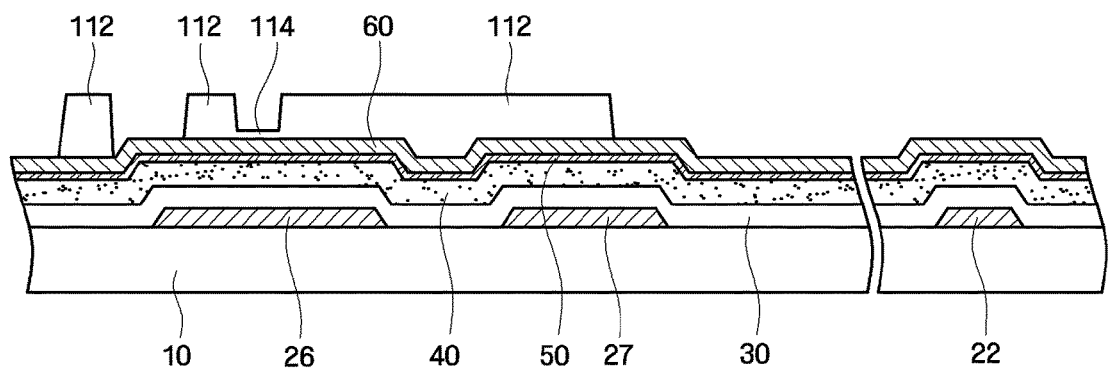

Referring to FIG. 12, the photoresist layer 110 is exposed to light by using a mask and then developed to form photoresist layer patterns 112 and 114. The photoresist layer pattern 114 is disposed over a channel region of a TFT, that is, disposed in a region between a source electrode 65 (see FIG. 15) and a drain electrode 66 (see FIG. 15) to be defined by etching in this region into the buffer layer 50 and conductive layer 60. In addition, the photoresist layer pattern 112 is disposed in a data-wiring region, that is, a region where data wiring is to be formed. The photoresist layer pattern 114 is thinner than the photoresist layer pattern 112. The entire photoresist layer 110 is removed, except for the above-described portions remaining in the channel region and the data-wiring region (see FIG. 12, photoresist layer patterns 112 and 114). In this case, a ratio of a thickness of the photoresist layer pattern 114 remaining in the channel region to that of the photoresist layer pattern 112 remaining in the data-wiring region may vary according to the processing conditions of etching processes which will be described later.

To vary the thickness of the photoresist layer 110 according to the position thereof as described above, various methods may be used. For example, a mask having slits, a lattice pattern, or a semi-transparent film may be used to control the amount of light that passes through the photoresist layer 110, and hence the depth of the exposure of the pattern. Alternatively, the photoresist layer 110 may made of a photoresist material that can reflow after an initial pattern is formed in the photoresist layer 110. In this case, the photoresist layer 110 may be exposed to light by using a conventional mask that is divided into a region through which light can completely pass and a region through which light cannot completely pass. Then, the photoresist layer 110 may be developed and reflowed, so that part of the photoresist layer 110 can flow to a region without the photoresist layer 110. As a result, the thin photoresist layer pattern 114 may be formed.

Figure 13:
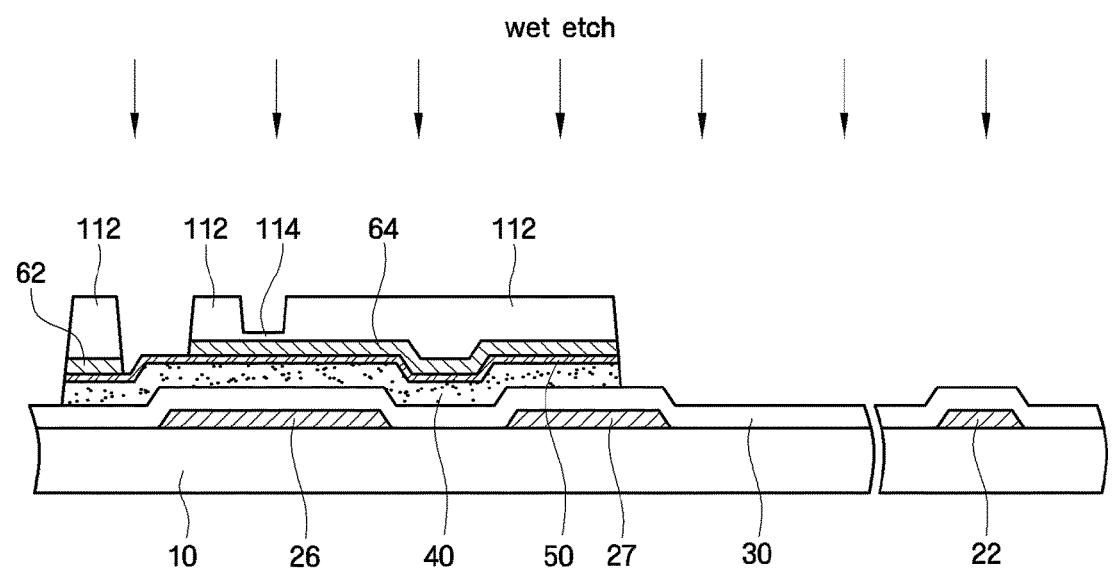

Referring to FIGS. 12 and 13, the conductive layer 60 is etched by using the photoresist layer patterns 112 and 114 as an etching mask. Here, the conductive layer 60 may be wet-etched or dry-etched. In the wet-etching process, a mixture of phosphoric acid, nitric acid and acetic acid, or a mixture of hydrofluoric acid (HF) and deionized water, may be used as an etchant. Then, the entire conductive layer 60 is removed, except for its portions corresponding to a data line 62 and a conductive layer pattern 64 for forming the source and drain electrodes 65 and 66. After the conductive layer 60 is removed, the oxide active layer 40 disposed under the conductive layer 60 is exposed. The data line 62 and the conductive layer pattern 64 are shaped like data wiring (i.e., the data line 62, the source electrode 65, the drain electrode 66, and a drain electrode extension portion 67 in FIG. 15), except that the conductive layer pattern 64 is not yet divided into the source electrode 65 (see FIG. 15) and the drain electrode 66 (see FIG. 15).

Figure 14:
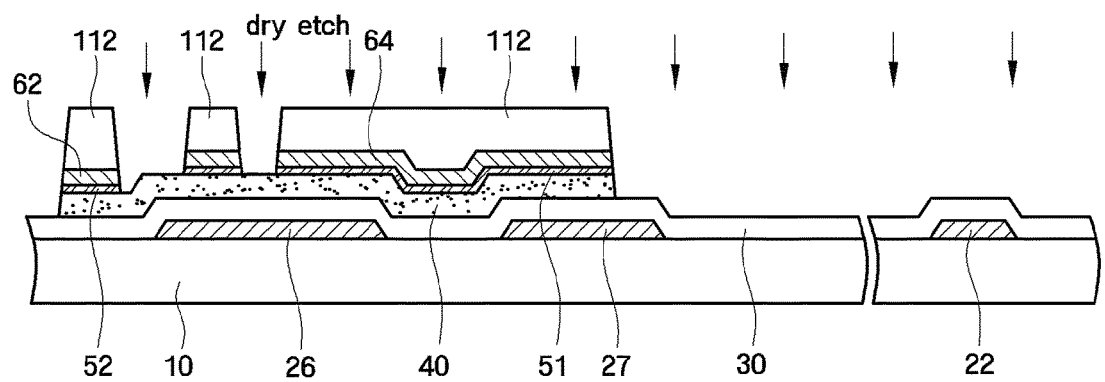

Referring to FIGS. 13 and 14, the photoresist layer patterns 112 and 114 may be etched back (not shown) to remove the photoresist layer pattern 114 in the channel region. In addition, residues of the photoresist layer 110, which remain on the exposed surface of the conductive layer pattern 64 after photoresist layer developing, are removed by an ashing process. Next, the conductive layer pattern 64 in the channel region is wet-etched or dry-etched (arrows) by using the photoresist layer pattern 112 as an etching mask. In the wet-etching process, a mixture of phosphoric acid, nitric acid and acetic acid or a mixture of hydrofluoric acid (HF) and deionized water may be used as an etchant. While a wet etch is illustrated in FIG. 13 as an exemplary etch, it should not be considered as limiting thereto.

As a result, as shown in FIG. 14, the source electrode 65 is separated from the drain electrode 66 to complete the data wiring (i.e., the data line 62, the source electrode 65, the drain electrode 66, and a drain electrode extension portion 67). The buffer layer 50 is etched by using the photoresist layer patterns 112 and 114 as an etching mask to form buffer layer patterns 52 and 55 through 57. In the exemplary embodiment, in FIG. 14, the buffer layer 50 may be dry-etched. In this case, an etching gas mixture having a high etching selectivity with respect to the buffer layer 50 may be used so as to avoid etching the oxide active layer 40. The etching gas may be a mixture of sulfur hexafluoride ($SF_6$) and oxygen ($O_2$), or a mixture of chlorine ($Cl_2$) and oxygen ($O_2$). When the buffer layer 50 is dry-etched in this way, the incomplete buffer layer patterns 51 and 52 may be formed, thereby reducing damage to the oxide active layer 40.

Figure 15:
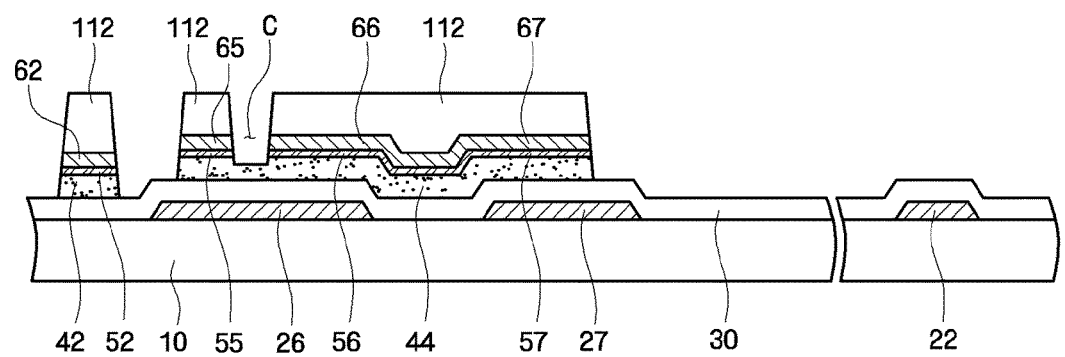

Referring to FIG. 15, the oxide active layer 40 is etched to form oxide active layer patterns 42 and 44. In this case, the oxide active layer 40 may be partially etched while the gate insulating film 30 is not etched. In addition, the oxide active layer 40 may be wet-etched or dry-etched. In the wet-etching process, an etchant, which contains de-ionized water mixed with hydrofluoric acid (HF), sulfuric acid, hydrochloric acid or a combination of the same, may be used. In the dry-etching process, a fluorine-based etching gas, such as carbon hydrotrifluoride ("fluoroform", $CHF_3$) or carbon tetrafluoride ($CF_4$), may be used. Specifically, a fluorine-based etching gas mixed with argon (Ar) or helium (He) may be used. Meanwhile, part of the active layer pattern 44 in the channel region ("C" in FIG. 15) may also be removed by a predetermined thickness.

Figure 16:
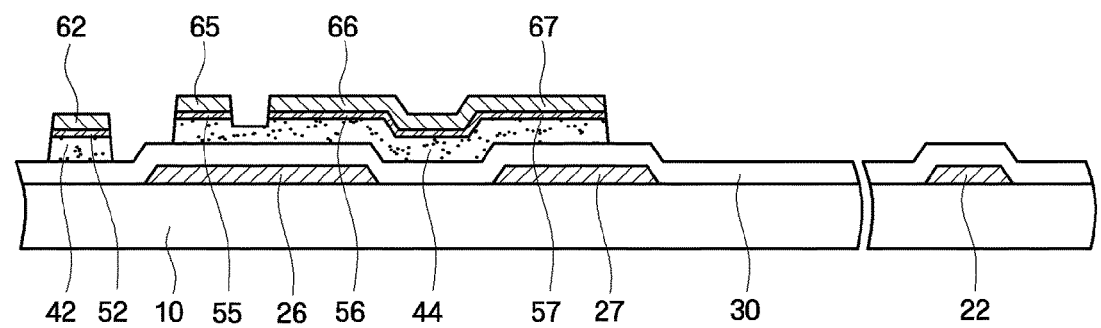

Referring to FIG. 16, the photoresist layer pattern 112 remaining on the data wiring (i.e., the data line 62, the source electrode 65, the drain electrode 66, and a drain electrode extension portion 67) is removed by stripping and/or ashing.

Figure 17:
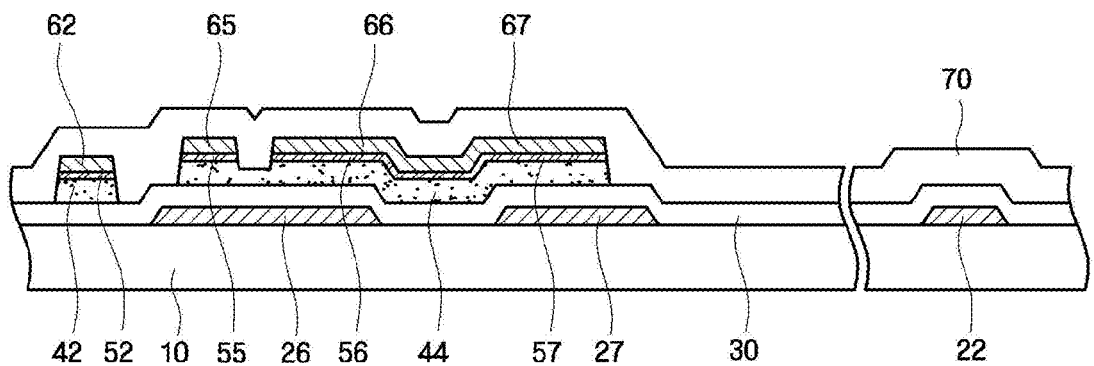

Referring to FIGS. 16 and 17, a passivation layer 70, which is made of silicon nitride (SiNx), is formed on the oxide active layer patterns 42 and 44 and the data wiring. The passivation layer 70 may be deposited by, for example, reactive CVD.

Figure 18:
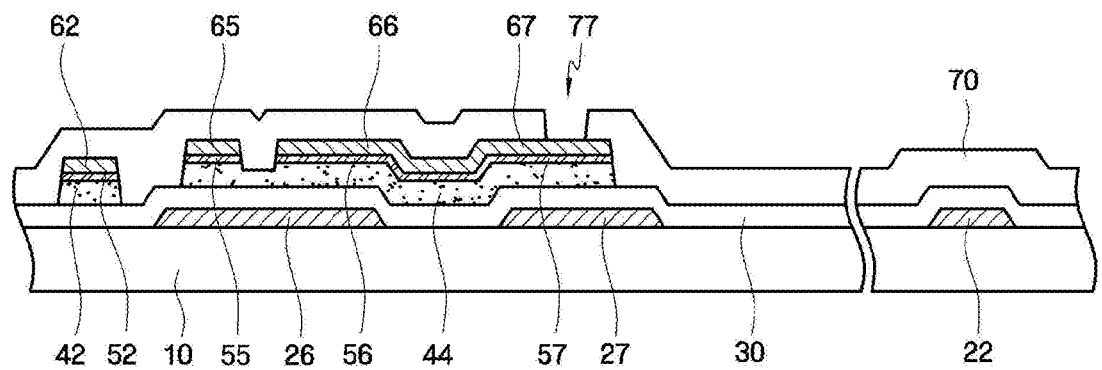
Figure 19:
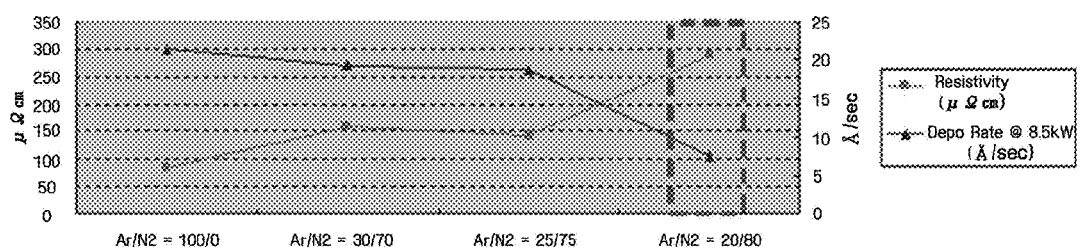
FIG. 19 is a graph illustrating processing conditions under which the TFT substrate according to the third exemplary embodiment is fabricated.

Referring to FIG. 18, a photolithography process is performed on the passivation layer 70 to form a contact hole 77 which exposes the drain electrode extension portion 67.

Finally, a transparent conductor or a reflective conductor such as indium tin oxide (ITO) or indium zinc oxide (IZO) is deposited, and a photolithography process is performed on the transparent or reflective conductor to form a pixel electrode 82 which is connected to the drain electrode extension portion 67. As a result, the TFT substrate is completed as shown in FIG. 1B.

Hereinafter, a TFT substrate according to a fourth embodiment will be described in detail with reference to FIGS. 1B and 20. FIG. 20 is a cross-sectional view for explaining a method of fabricating the TFT substrate according to the fourth embodiment.

First, an oxide active layer 40 is formed in the process described above with reference to FIG. 9.

Referring to FIG. 10, a buffer layer 50 which includes molybdenum as a second material is deposited on the oxide active layer 40.

Next, the processes of FIGS. 11 through 13 are performed.

Referring to FIG. 20, the buffer layer 50 (see FIGS. 10 through 13) is wet-etched to form buffer layer patterns 52 and 55 through 57. In this case, a buffer layer material having a high etching selectivity over the material of the oxide active layer 40 may be used to reduce damage to the oxide active layer 40. A conductive layer pattern 64 for forming a source and a drain and the buffer layer 50 may be successively etched by using the same etchant.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A thin-film transistor substrate comprising:
   gate wiring which is formed on an insulating substrate;
   oxide active layer patterns which are formed on the gate wiring and comprise an oxide of a first material, wherein the first material comprises zinc or indium;
   buffer layer patterns which are disposed on the oxide active layer patterns to directly contact the oxide active layer patterns, the buffer layer patterns comprising a second material wherein the second material is titanium nitride, molybdenum, amorphous indium tin oxide, or indium zinc oxide; and
   data wiring which is formed on the buffer layer patterns to insulatedly cross the gate wiring,
   wherein a Gibbs free energy of the oxide of the first material is lower than the Gibbs free energy of an oxide of the second material.

2. The TFT substrate of claim 1, wherein the oxide of the first material is gallium indium zinc oxide, hafnium indium zinc oxide, or zinc oxide.

3. The TFT substrate of claim 1, wherein the data wiring comprises aluminum or copper.

4. The TFT substrate of claim 1, wherein the buffer layer patterns have a thickness of 50 to 1,000 Å.

5. A TFT substrate comprising:
   gate wiring which is formed on an insulating substrate;
   oxide active layer patterns which are formed on the gate wiring and comprise indium zinc oxide, and hafnium or gallium;
   buffer layer patterns disposed on the oxide active layer patterns to directly contact the oxide active layer patterns, the buffer layer patterns comprising titanium nitride or molybdenum; and
   data wiring formed on the buffer layer patterns to insulatedly cross the gate wiring,
   wherein a Gibbs free energy of an oxide of hafnium or an oxide of gallium, that of an oxide of indium, and that of an oxide of zinc are each lower than a Gibbs free energy of an oxide of titanium nitride or an oxide of molybdenum.

6. The TFT substrate of claim 5, wherein the data wiring comprises aluminum or copper.

7. The TFT substrate of claim 6, wherein the oxide active layer patterns comprise hafnium indium zinc oxide, and the buffer layer patterns comprise titanium nitride.

8. The TFT substrate of claim 7, wherein the buffer layer patterns have a thickness of 50 to 1,000 Å.

9. The TFT substrate of claim 6, wherein the oxide active layer patterns comprise gallium indium zinc oxide, and the buffer layer patterns comprise molybdenum.

10. A method of fabricating a TFT substrate, the method comprising:
    forming gate wiring on an insulating substrate; and
    forming oxide active layer patterns, which comprise an oxide of a first material, wherein the first material comprises zinc or indium, on the gate wiring;
    forming buffer layer patterns, which comprise a second material wherein the second material is titanium nitride, molybdenum, amorphous indium tin oxide, or indium zinc oxide, on the oxide active layer patterns to directly contact the oxide active layer patterns; and
    forming data wiring on the buffer layer patterns to insulatedly cross the gate wiring,
    wherein a Gibbs free energy of the oxide of the first material is lower than a Gibbs free energy of an oxide of the second material.

11. The method of claim 10, wherein the data wiring is formed by a wet-etching method.

12. The method of claim 10, wherein the forming of the data wiring comprises sputtering copper or aluminum at a temperature of 80 to 100° C.

13. The method of claim 10, wherein the buffer layer patterns comprise titanium nitride and are formed by a dry-etching method.

14. The method of claim 10, wherein the buffer layer patterns comprise molybdenum and are formed by the wet-etching method.

15. A method of fabricating a TFT substrate, the method comprising:
    forming gate wiring on an insulating substrate;
    forming oxide active layer patterns, which comprise indium zinc oxide, and hafnium or gallium, on the gate wiring;
    forming buffer layer patterns, which comprise titanium nitride or molybdenum, on the oxide active layer patterns to directly contact the oxide active layer patterns; and
    forming data wiring on the buffer layer patterns to insulatedly cross the gate wiring,
    wherein a Gibbs free energy of an oxide of hafnium or an oxide of gallium, that of an oxide of indium, and that of an oxide of zinc are each lower than a Gibbs free energy of an oxide of titanium nitride or an oxide of molybdenum.

16. The method of claim 15, wherein the buffer layer patterns comprise titanium nitride, the data wiring is formed by a wet-etching method, and the buffer layer patterns are formed by a dry-etching method.

17. The method of claim 16, wherein forming the buffer layer patterns comprises sputtering titanium by with argon and nitrogen as reactive gases.

18. The method of claim 17, wherein a ratio of a flow rate of argon to a flow rate of nitrogen is 20:80 to 5:95.

19. The method of claim 16, wherein the buffer layer patterns comprise molybdenum, and the data wiring and the buffer layer patterns are formed by a wet-etching method.

20. The method of claim 16, wherein forming the data wiring comprises sputtering copper or aluminum at a temperature of 80 to 100° C.

* * * * *